US 12,294,797 B2

(12) United States Patent
Kim et al.

(10) Patent No.: US 12,294,797 B2
(45) Date of Patent: May 6, 2025

(54) IMAGE SENSORS INCLUDING PHASE DETECTION PIXEL

(71) Applicant: SAMSUNG ELECTRONICS CO., LTD., Suwon-si (KR)

(72) Inventors: Hongki Kim, Hwaseong-si (KR); Minkyung Kim, Yongin-si (KR); Minkwan Kim, Hwaseong-si (KR); Minho Jang, Suwon-si (KR); Insung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/336,495

(22) Filed: Jun. 16, 2023

(65) Prior Publication Data

US 2023/0328404 A1 Oct. 12, 2023

Related U.S. Application Data

(63) Continuation of application No. 17/812,795, filed on Jul. 15, 2022, now Pat. No. 11,910,112, which is a
(Continued)

(30) Foreign Application Priority Data

Oct. 22, 2019 (KR) ........................ 10-2019-0131579

(51) Int. Cl.
*H04N 25/704* (2023.01)
*H01L 27/146* (2006.01)
*H04N 25/11* (2023.01)

(52) U.S. Cl.
CPC ..... *H04N 25/704* (2023.01); *H01L 27/14621* (2013.01); *H01L 27/14627* (2013.01);
(Continued)

(58) Field of Classification Search
CPC .................. H04N 25/704; H04N 25/11; H01L 27/14621; H01L 27/14627;
(Continued)

(56) References Cited

U.S. PATENT DOCUMENTS 9,515,114 B2 12/2016 Ootsuka
9,768,215 B2 9/2017 Kikuchi
(Continued)

FOREIGN PATENT DOCUMENTS

CN 106210527 12/2016
CN 106303264 1/2017
(Continued)

OTHER PUBLICATIONS

Office Action dated May 14, 2024 in corresponding Japanese Patent Application No. 2020-176720 (in Japanese), 8 pages.
(Continued)

*Primary Examiner* — Timothy J Henn
*Assistant Examiner* — John H Morehead, III
(74) *Attorney, Agent, or Firm* — MORGAN, LEWIS & BOCKIUS LLP

(57) ABSTRACT

An image sensor is presented which includes a pixel array including a plurality of image sensing pixels in a substrate, a phase detection shared pixel in the substrate, the phase detection shared pixel including two phase detection sub-pixels arranged next to each other, a color filter fence disposed on the plurality of image sensing pixels and the phase detection shared pixel, the color filter fence defining a plurality of color filter spaces, a plurality of color filter layers respectively disposed in the plurality of color filter spaces on the plurality of image sensing pixels and the phase detection shared pixel, a first micro-lens disposed on each of the plurality of image sensing pixels to have a first height, and a second micro-lens disposed to vertically over-
(Continued)

lap the two phase detection subpixels of the phase detection shared pixel and to have a second height greater than the first height.

20 Claims, 40 Drawing Sheets

Related U.S. Application Data continuation of application No. 16/986,759, filed on Aug. 6, 2020, now Pat. No. 11,412,165.

(52) U.S. Cl.
CPC .... *H01L 27/14629* (2013.01); *H01L 27/1464* (2013.01); *H01L 27/14641* (2013.01); *H01L 27/14645* (2013.01); *H01L 27/14685* (2013.01); *H04N 25/11* (2023.01)

(58) Field of Classification Search
CPC ........... H01L 27/14629; H01L 27/1464; H01L 27/14641; H01L 27/14645; H01L 27/14685; H01L 27/14607; H01L 27/1463; H01L 27/14605
See application file for complete search history.

(56) References Cited

U.S. PATENT DOCUMENTS

| | | | |
|---|---|---|---|
| 9,893,111 B2 | 2/2018 | Chou et al. | |
| 9,906,706 B2 | 2/2018 | Wang | |
| 9,935,146 B1* | 4/2018 | Lee | H01L 27/14689 |
| 9,985,066 B2 | 5/2018 | Noudo et al. | |
| 10,002,899 B2 | 6/2018 | Chou et al. | |
| 10,015,389 B2 | 7/2018 | Lu et al. | |
| 10,044,959 B2 | 8/2018 | Galor | |
| 10,204,946 B1* | 2/2019 | Boettiger | H01L 27/14645 |
| 10,276,615 B2 | 4/2019 | Shibuta | |
| 10,284,799 B2 | 5/2019 | Yokogawa et al. | |
| 10,341,595 B2 | 7/2019 | Jung et al. | |
| 10,440,301 B2 | 10/2019 | Li et al. | |
| 10,872,927 B2 | 12/2020 | Kim et al. | |
| 11,069,730 B2 | 7/2021 | Nakajiki et al. | |
| 11,412,165 B2* | 8/2022 | Kim | H04N 25/704 |
| 2012/0273906 A1* | 11/2012 | Mackey | H01L 27/14685 257/E31.127 |
| 2014/0306360 A1 | 10/2014 | Li et al. | |
| 2015/0062390 A1* | 3/2015 | Kim | H01L 27/14621 348/273 |
| 2017/0077163 A1 | 3/2017 | Chou et al. | |
| 2017/0094210 A1* | 3/2017 | Galor Gluskin | H04N 25/704 |
| 2017/0347042 A1* | 11/2017 | Borthakur | H04N 23/672 |
| 2018/0026065 A1* | 1/2018 | Hsieh | H01L 27/14605 257/432 |
| 2018/0352199 A1* | 12/2018 | Hwang | H01L 27/14636 |
| 2019/0132506 A1 | 5/2019 | Cheng et al. | |
| 2019/0157329 A1 | 5/2019 | Kim et al. | |
| 2019/0297291 A1* | 9/2019 | Kim | G02B 7/09 |
| 2019/0339422 A1* | 11/2019 | Lu | G03F 1/00 |
| 2019/0394389 A1* | 12/2019 | Lu | H01L 27/14645 |
| 2020/0235149 A1 | 7/2020 | Shiraishi et al. | |
| 2021/0120198 A1 | 4/2021 | Kim et al. | |
| 2021/0193720 A1* | 6/2021 | Seo | H01L 27/14627 |
| 2022/0353446 A1 | 11/2022 | Kim et al. | |
| 2023/0328404 A1* | 10/2023 | Kim | H01L 27/1464 348/302 |

FOREIGN PATENT DOCUMENTS

| | | |
|---|---|---|
| CN | 106549025 | 3/2017 |
| CN | 107872618 | 4/2018 |
| CN | 109390361 A | 2/2019 |
| CN | 109474771 | 3/2019 |
| CN | 109661727 A | 4/2019 |
| JP | 2016-001682 A2 | 1/2016 |
| JP | 2017-054984 A2 | 3/2017 |
| JP | 2018-014476 A2 | 1/2018 |
| JP | 2018-201015 A2 | 12/2018 |
| JP | 2018-207035 A2 | 12/2018 |
| KR | 10-2018-0133157 A | 12/2018 |
| KR | 10-2019-0010136 A | 1/2019 |

OTHER PUBLICATIONS

Office Action dated Feb. 27, 2024 in related Korean Patent Application No. 10-2019-0131579, 5 pages (in Korean).
Office Action dated Jun. 26, 2023, in corresponding U.S. Appl. No. 17/812,795 (20 pages).
Notice of Allowance dated Mar. 4, 2025 issued in corresponding Japanese Patent Application No. 2020-176720.

* cited by examiner

IMAGE SENSORS INCLUDING PHASE DETECTION PIXEL

CROSS-REFERENCE TO RELATED APPLICATION

This application claims the benefit of Korean Patent Application No. 10-2019-0131579, filed on Oct. 22, 2019, in the Korean Intellectual Property Office, U.S. patent application Ser. No. 16/986,759, filed on Aug. 6, 2020, and U.S. patent application Ser. No. 17/812,795, filed on Jul. 15, 2022, the disclosures of which are incorporated by reference herein in their entirety.

BACKGROUND

The inventive concept relates to an image sensor, and more particularly, to an image sensor including phase detection pixels.

Image sensors are devices used to capture light information and convert the captured light information into an electrical signal to create an image. Image sensors are present in numerous devices. For example, they are used in cameras, phones, medical imaging devices, thermal imaging devices, and night imaging devices.

In some cases, image sensors include image sensing pixels which receive light and convert the received light into an electrical signal. Image sensors may also include numerous photodiode regions, where an auto focusing function may be performed by an image sensor to accurately capture an image for a short time.

A micro-lens is a small lens located on an image sensing pixel. A micro-lens may be used to provide quality optics to the image sensor. Micro-lenses on image sensing pixels may be produced at the same time, e.g., during the same manufacturing process. However, simultaneous production of micro-lenses may result in non-optimized lenses. For example, all lenses that are produced might be uniform. But customization of micro-lenses for different image sensing pixels can provide improved optics for an image sensor. Therefore, there is a need in the art for manufacturing processes capable of producing different micro-lenses for different image sensing pixels of an image sensor.

SUMMARY

The inventive concept provides an image sensor which quickly and accurately performs an auto focusing function and enhances a sensitivity of an image sensing pixel.

According to an aspect of the inventive concept, there is provided an image sensor including a pixel array, wherein the pixel array includes a plurality of image sensing pixels provided in a substrate, a phase detection shared pixel provided in the substrate, the phase detection shared pixel including two phase detection subpixels arranged next to each other, a color filter fence disposed on the plurality of image sensing pixels and the phase detection shared pixel, the color filter fence defining a plurality of color filter spaces, a plurality of color filter layers respectively disposed in the plurality of color filter spaces on the plurality of image sensing pixels and the phase detection shared pixel, a first micro-lens disposed on each of the plurality of image sensing pixels to have a first height, and a second micro-lens disposed to vertically overlap the two phase detection subpixels of the phase detection shared pixel and to have a second height which is greater than the first height.

According to another aspect of the inventive concept, there is provided an image sensor including a pixel array, wherein the pixel array includes a plurality of image sensing shared pixels each including a plurality of image sensing subpixels corresponding to a color filter layer having the same color, a plurality of phase detection shared pixels each including two phase detection subpixels configured to generate a phase signal for calculating a phase difference between images, and a micro-lens structure disposed on the plurality of image sensing shared pixels and the plurality of phase detection shared pixels, and the micro-lens structure includes a first micro-lens disposed on each of the plurality of image sensing pixels to have a first height and a second micro-lens disposed on the two phase detection subpixels to have a second height which is greater than the first height.

According to another aspect of the inventive concept, there is provided an image sensor including a pixel array, wherein the pixel array includes a plurality of image sensing pixels provided in a substrate, a phase detection shared pixel provided in the substrate, the phase detection shared pixel configured to generate a phase signal for calculating a phase difference between images, the phase detection shared pixel including two phase detection subpixels arranged next to each other in a first direction parallel to an upper surface of the substrate, a pixel separation structure disposed between the plurality of image sensing pixels, between the two phase detection subpixels, and between the phase detection shared pixel and an image sensing pixel adjacent thereto to pass through the substrate, a color filter fence disposed on the plurality of image sensing pixels and the phase detection shared pixel, the color filter fence defining a plurality of color filter spaces, a plurality of color filter layers respectively disposed in the plurality of color filter spaces on the plurality of image sensing pixels and the phase detection shared pixel, a first micro-lens disposed on each of the plurality of image sensing pixels to have a first height, and a second micro-lens disposed on the two phase detection subpixels to have a second height which is greater than the first height, and a center line of the second micro-lens in the first direction vertically overlaps a portion of the pixel separation structure disposed between the two phase detection subpixels.

According to another aspect of the inventive concept, a method of manufacturing an image sensor is described, the method comprising: providing a plurality of pixels on a substrate, wherein the plurality of pixels includes one or more first pixels and one or more second pixels; providing a first micro-lens on each of the one or more first pixels using a first process; and providing a second micro-lens on each of the one or more second pixels using a second process, wherein the first micro-lens comprises a different shape from the second micro-lens.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

The present disclosure relates generally to micro-lenses of image sensing pixels in an image sensor. Conventional methods form micro-lenses for different pixels during the same manufacturing. For example, a process might produce a micro-lens of a first pixel and a micro-lens of a second pixel at the same time based on the same process conditions. Therefore, the height of the first micro-lens of the first pixel may be the same as that of the second micro-lens of the second pixel. However, the curvature of the first micro-lens and the curvature of the second micro-lens may not be optimized. As a result, separation ratio characteristics, sensitivity, and signal-to-noise (SNR) characteristics of the first and second pixels can be suboptimal.

Therefore, embodiments of the present disclosure describe a process for producing different micro-lenses for different pixels in an image sensor. For example, a first micro-lens for a first pixel and a second micro-lens for a second pixel can be formed through different processes. Therefore, the curvature of the first micro-lens and the curvature of a second micro-lens can be optimized, thereby improving pixel characteristics. Additionally, a grid size of the first pixel and a grid size of a micro-lens of the second pixel may be set independently. Therefore, separation ratio characteristics of the first pixel may be improved.

Hereinafter, embodiments will be described in detail with reference to the accompanying drawings.

Figure 1:
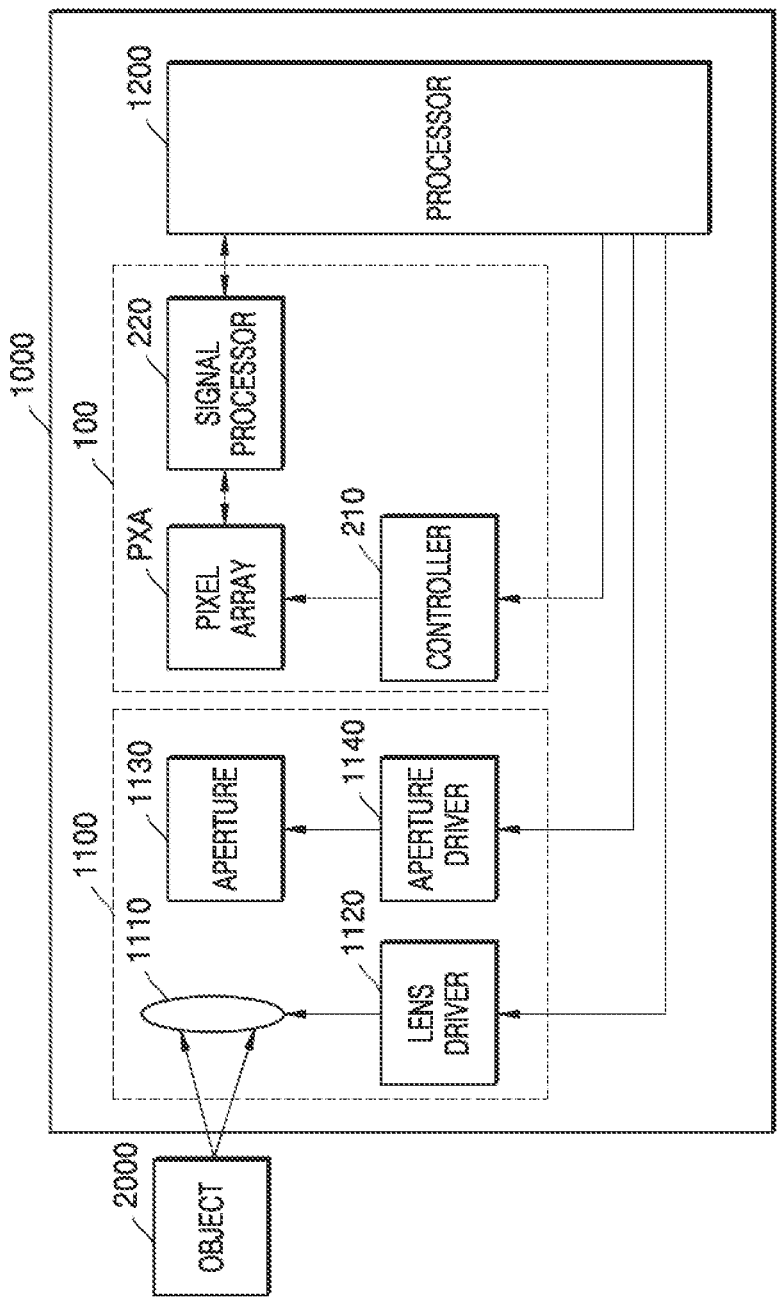
FIG. 1 is a block diagram illustrating an image processing device according to embodiments.

FIG. 1 is a block diagram illustrating an image processing device 1000 according to embodiments.

Referring to FIG. 1, the image processing device 1000 may be a digital imaging device for performing an auto-focusing (AF) function. The image processing device 1000 may include an imaging unit 1100, an image sensor 100, and a processor 1200. The image processing device 1000 may include a focus detection function for an AF function.

The imaging unit 1100 may include a lens 1110, a lens driver 1120, an aperture 1130, and an aperture driver 1140.

The lens driver 1120 may transmit or receive information about focus detection through communication with the processor 1200. The lens driver 1120 may also adjust a position of the lens 1110 based on a control signal provided from the processor 1200. Therefore, a distance between the lens 1110 and an object 2000 may be adjusted, and a focus on the object 2000 may be matched or mismatched based on a position of the lens 1110. For example, when the distance between the lens 1110 and the object 2000 is relatively short, the lens 1110 may deviate from an in-focus position for adjusting a focus on the object 2000. A phase difference between images formed in the image sensor 100 may then occur. In this case, the lens driver 1120 may move the lens 1110 in a direction in which a distance to the object 2000 increases, based on the control signal provided from the processor 1200.

The image sensor 100 may convert incident light into an image signal. The image sensor 100 may include a pixel array PXA, a controller 210, and a signal processor 220. An optical signal passing through the lens 1110 and the aperture 1130 may reach a light-receiving surface of the pixel array PXA to form a phase of the object 2000. The pixel array PXA, as described below with reference to FIG. 2, may include a plurality of pixels PX. The plurality of pixels PX may include a plurality of image sensing pixels IPX and a plurality of phase detection pixels PPX.

The processor 1200 may receive pixel information from the signal processor 220 to perform a phase difference calculation. The phase difference calculation may be performed by performing a correlation operation on a column signal corresponding to the plurality of pixels PX. The processor 1200 may calculate an in-focus position, a focus direction, or a distance between the object 2000 and the image sensor 100 based on a result of the phase difference calculation. The processor 1200 may output the control signal to the lens driver 1120 to move a position of the lens 1110, based on the result of the phase difference calculation.

Figure 2:
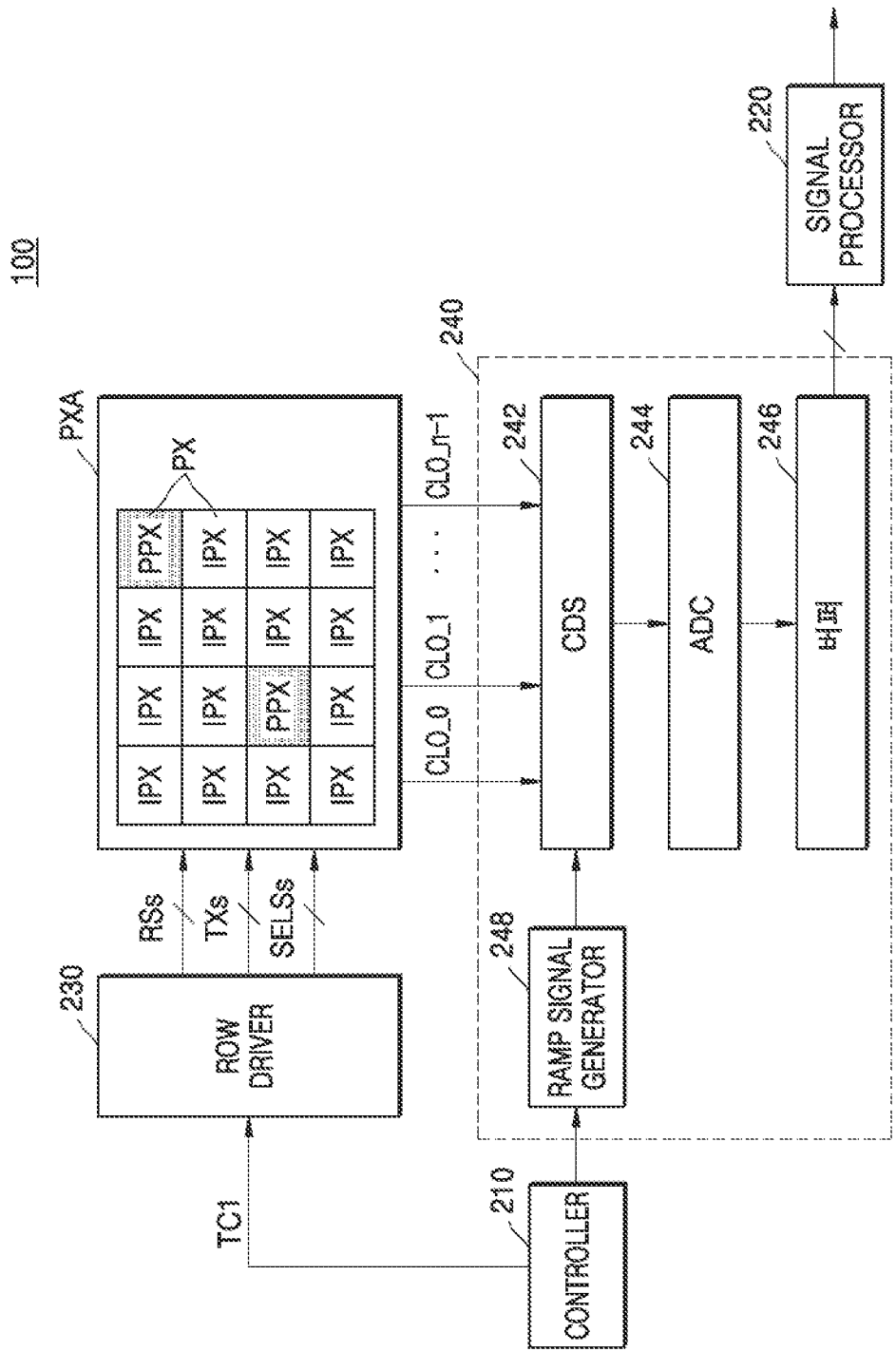
FIG. 2 is a block diagram illustrating an image sensor according to embodiments.

FIG. 2 is a block diagram illustrating an image sensor 100 according to embodiments.

Referring to FIG. 2, the image sensor 100 may include a pixel array PXA, a controller 210, a signal processor 220, a row driver 230, and a signal read unit 240.

The pixel array PXA may be provided by units of pixels and may include a plurality of pixels PX. Each of the plurality of pixels PX may include a photoelectric conversion region (for example, a photodiode) corresponding thereto. Each of the plurality of pixels PX may absorb light to generate an electrical charge. An electrical signal, such as an output voltage, may be provided to the signal read unit 240, based on the generated electrical charge.

The pixel array PXA may include a plurality of image sensing pixels IPX and a plurality of phase detection pixels PPX. The plurality of image sensing pixels IPX may generate image signals corresponding to the object 2000 (see FIG. 1). The plurality of phase detection pixels PPX may generate phase signals used to calculate a phase difference between images.

The plurality of phase detection pixels PPX included in the image sensor 100 may be used to adjust a focus on the object 2000. The phase signals may include information about positions of images formed in the image sensor 100.

Therefore, the phase signals may be used to calculate phase differences between the images. An in-focus position of the lens 1110 (see FIG. 1) may be calculated based on the calculated phase differences. For example, a position of the lens 1110 allowing a phase difference to be zero may be an in-focus position.

In embodiments of the present disclosure, the plurality of phase detection pixels PPX may be used to measure a distance between the object 2000 and the image sensor 100. Additionally, the plurality of phase detection pixels PPX may be used to adjust a focus on the object 2000. Pieces of additional information, such as phase differences between the images formed in the image sensor 100, a distance between the lens 1110 and the image sensor 100, a size of the lens 1110, and an in-focus position of the lens 1110 may be used for measuring the distance between the object 2000 and the image sensor 100.

The controller 210 may control the row driver 230 so that the pixel array PXA absorbs light to accumulate electrical charges or to temporarily store the accumulated electrical charges and outputs an electrical signal based on the stored electrical charges to the outside of the pixel array PXA. Moreover, the controller 210 may control the signal read unit 240 to measure a level of a pixel signal provided by the pixel array PXA.

The row driver 230 may generate control signals RSs, TXs, and SELSs for controlling the pixel array PXA. Additionally, the row driver 230 may provide the control signals RSs, TXs, and SELSs to the plurality of pixels PX included in the pixel array PXA. The row driver 230 may also determine an activation timing and a deactivation timing of each of reset control signals RSs, transmission control signals TXs, and selection signals SELSs corresponding to the plurality of phase detection pixels PPX based on whether to perform the AF function.

The signal read unit 240 may include a correlated-double sampling (CDS) circuit 242, an analog-to-digital converter (ADC) 244, and a buffer 246. The CDS circuit 242 may sample and hold the output voltage provided from the pixel array PXA. The CDS circuit 242 may doubly sample a level of certain noise and a level based on the output voltage to output a level corresponding to a difference therebetween. Moreover, the CDS circuit 242 may receive a ramp signal, where the ramp signal is generated by a ramp signal generator 248. The CDS circuit 242 may also compare the ramp signal with the output voltage to output a comparison result. The ADC 244 may convert an analog signal, corresponding to the level received from the CDS circuit 242, into a digital signal. The buffer 246 may latch the digital signal. The latched digital signal may be sequentially output to the outside of the signal processor 220 or the image sensor 100.

The signal processor 220 may perform signal processing on data of the plurality of pixels PX received thereby. The signal processor 220 may perform noise decrease processing, gain adjustment, waveform standardization processing, interpolation processing, white balance processing, gamma processing, edge emphasis processing, etc. Moreover, the signal processor 220 may output information about the plurality of pixels PX to the processor 1200 to allow the processor 1200 to perform a phase difference calculation. For example, the plurality of pixels PX may be obtained in a phase difference AF operation.

Figure 3:
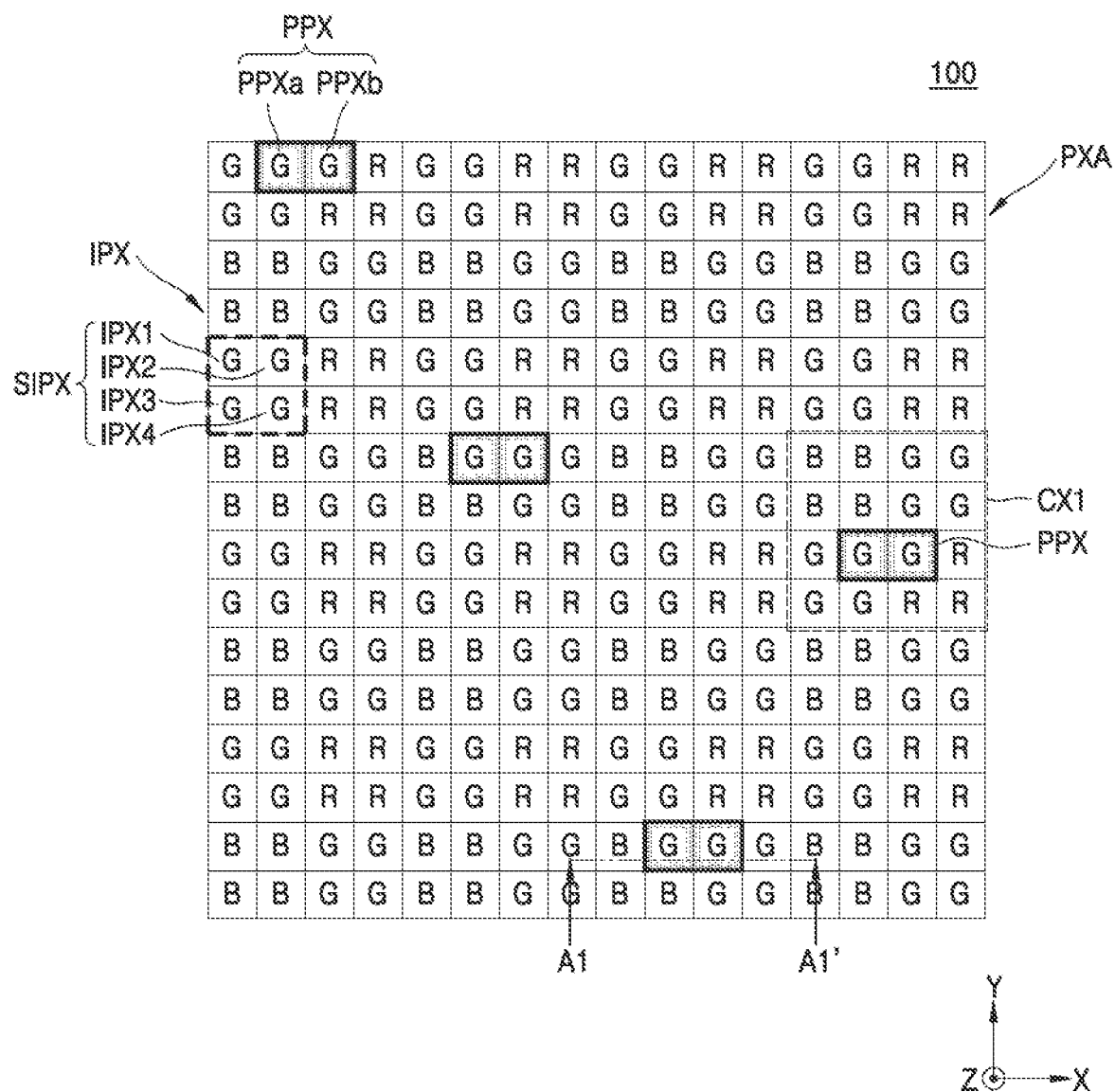
FIG. 3 is a layout view illustrating an image sensor according to embodiments.
Figure 4:
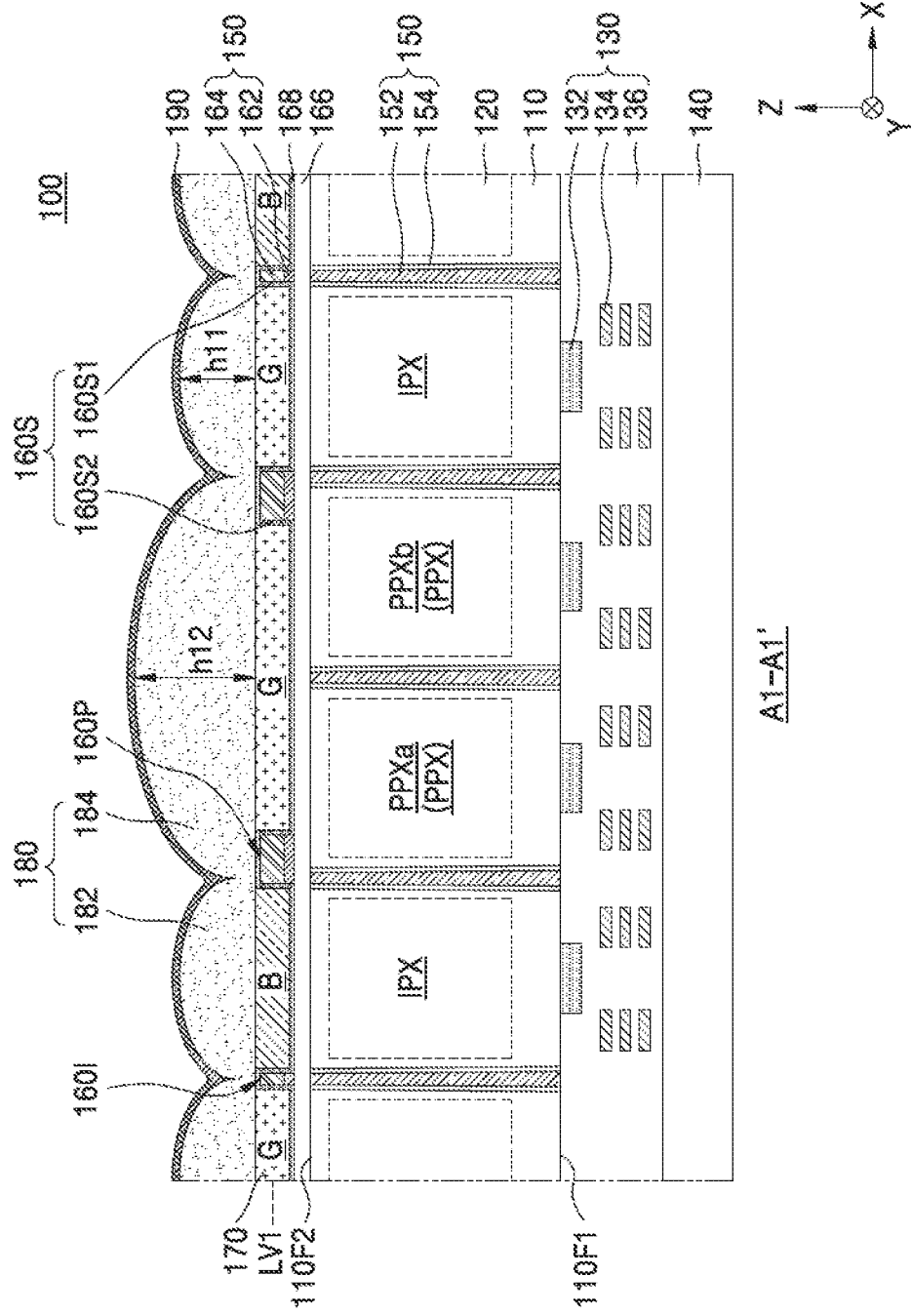
FIG. 4 is a cross-sectional view taken along line A1-A1' of FIG. 3.
Figure 5:
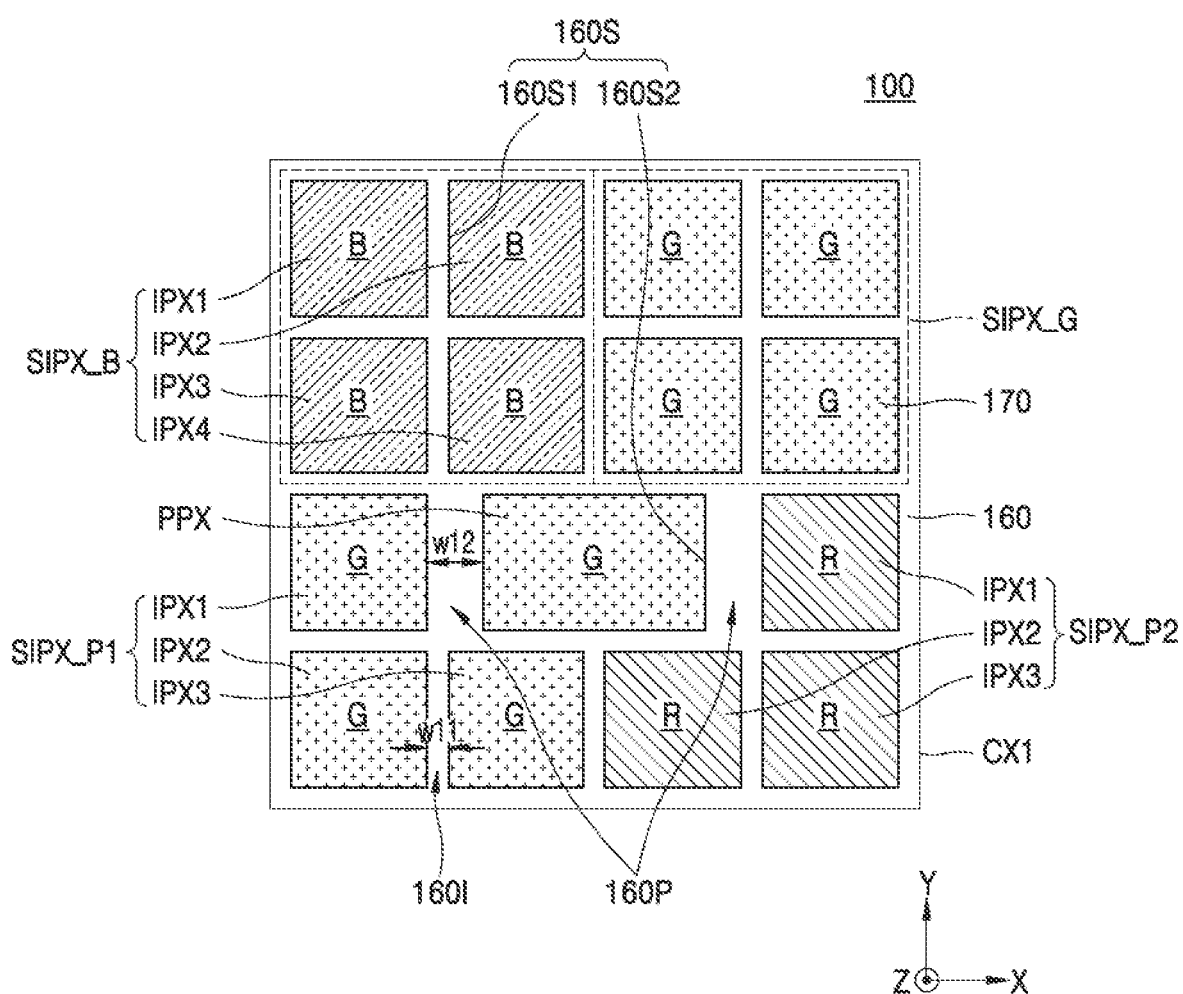
FIG. 5 is a horizontal cross-sectional view of a region CX1 of FIG. 3 cut at a first level LV1 of FIG. 4.
Figure 6:
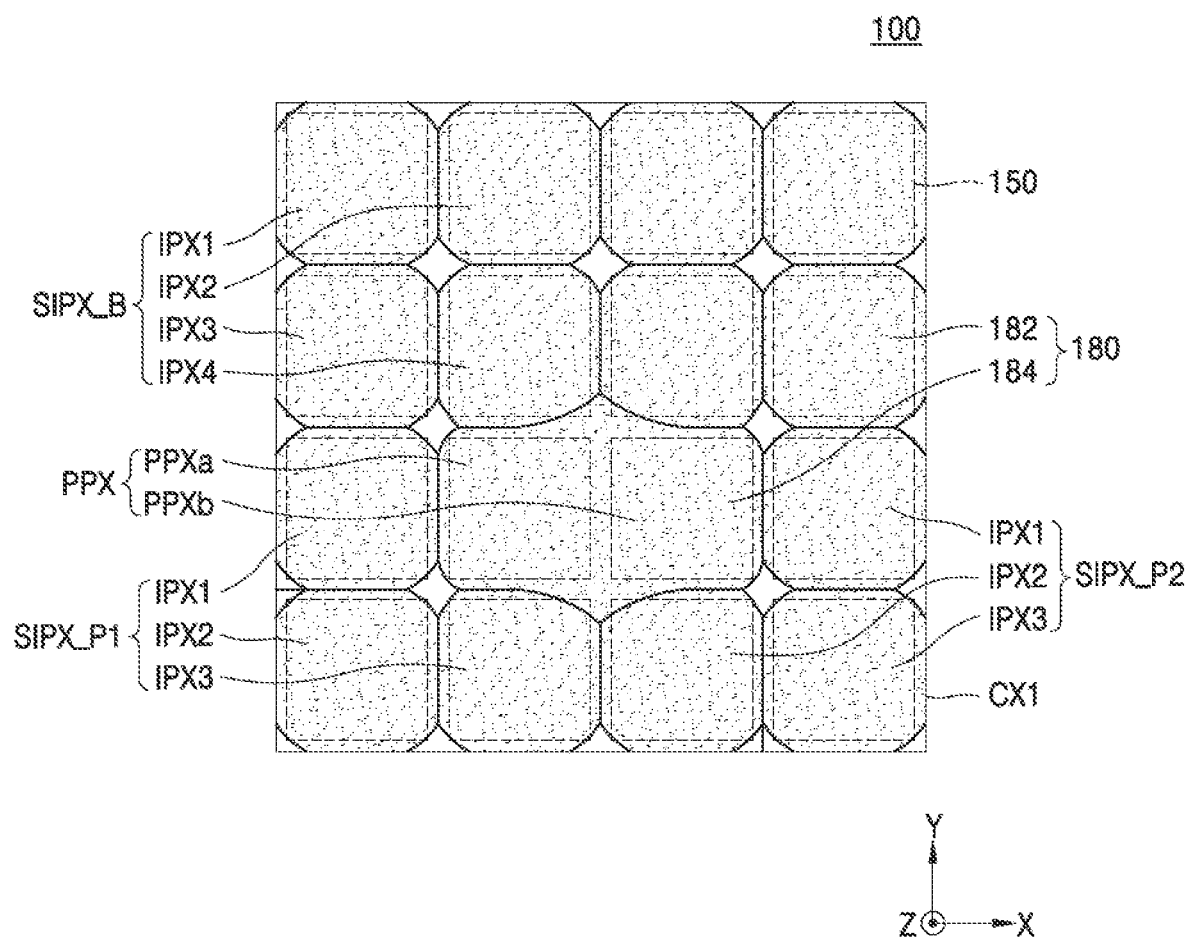
FIG. 6 is a plan view of the region CX1 of FIG. 3.

FIG. 3 is a layout view illustrating an image sensor 100 according to embodiments. FIG. 4 is a cross-sectional view taken along line A1-A1' of FIG. 3. FIG. 5 is a horizontal cross-sectional view of a region CX1 of FIG. 3 cut at a first level LV1 of FIG. 4, and FIG. 6 is a plan view of the region CX1 of FIG. 3.

Referring to FIG. 3, the image sensor 100 may include a pixel array PXA. The pixel array PXA may include a plurality of image sensing pixels IPX and a plurality of phase detection shared pixels PPX.

The plurality of image sensing pixels IPX may be arranged in a first direction (an X direction) and a second direction (a Y direction), where the first and second directions are parallel to a first surface 110F1 of a substrate 110. The first direction may be a column direction of the pixel array PXA. The second direction may be a row direction of the pixel array PXA. The plurality of phase detection shared pixels PPX may include first and second phase detection subpixels PPXa and PPXb disposed adjacent to each other in the first direction (the X direction). The plurality of phase detection shared pixels PPX may be disposed apart from one another by a certain interval between the plurality of image sensing pixels IPX, and for example, may be disposed at a density of 1/16, 1/32, or 1/64 of the total number of pixels PX. For example, in a case where the pixel array PXA is configured to include sixteen pixels PX in the first direction (the X direction) and sixteen pixels PX in the second direction (the Y direction) as illustrated in FIG. 3, the plurality of phase detection shared pixels PPX may include eight pixels PX and may be disposed at a density of 1/32.

As illustrated in FIG. 4, the plurality of image sensing pixels IPX and the plurality of phase detection shared pixels PPX may be disposed apart from one another by a pixel separation structure 150 in the substrate 110. A photoelectric conversion region 120 may be disposed in each of the plurality of image sensing pixels IPX and the plurality of phase detection shared pixels PPX.

The substrate 110 may include the first surface 110F1 and a second surface 110F2. Here, a surface of the substrate 110 on which a micro-lens structure 180 is disposed may be referred to as the second surface 110F2. A surface opposite to the second surface 110F2 may be referred to as the first surface 110F1. In embodiments of the present disclosure, the substrate 110 may include a P-type semiconductor substrate. For example, the substrate 110 may be a P-type silicon substrate. In additional embodiments of the present disclosure, the substrate 110 may include a P-type bulk substrate and a P-type or N-type epi layer grown thereon. In other embodiments, the substrate 110 may include an N-type bulk substrate and a P-type or N-type epitaxy layer grown thereon. Alternatively, the substrate 110 may be an organic plastic substrate. The photoelectric conversion region 120 may include a photodiode region (not shown) and a well region (not shown) each formed in the substrate 110.

Although not shown, an isolation layer (not shown) defining an active region (not shown) and a floating diffusion region FD (see FIG. 7) may be further formed on the first surface 110F1 of the substrate 110.

A front side structure 130 may be disposed on the first surface 110F1 of the substrate 110. The front side structure 130 may include a gate electrode 132, a wiring layer 134, and an insulation layer 136.

The gate electrode 132 may be disposed on the first surface 110F1 of the substrate 110 and may configure a plurality of transistors.

For example, the plurality of transistors may include a transmission transistor TX, a reset transistor RX, a drive transistor DX, and a selection transistor SX. The transmission transistor TX may be configured to transmit an electrical charge to the floating diffusion region FD, where the electrical charge is generated in the photoelectric conversion region 120. The reset transistor RX may be configured to periodically reset an electrical charge stored in the floating diffusion region FD. The drive transistor DX may be configured to act as a source follower buffer amplifier and to buffer a signal based on the electrical charge charged into the floating diffusion region FD. The selection transistor SX may be configured to perform a switching and addressing operation of selecting a plurality of image sensing pixels IPX. However, the plurality of transistors are not limited thereto.

In FIG. 4, the gate electrode 132 is illustrated as being formed as a planar type on the first surface 110F1 of the substrate 110, but some gate electrodes 132 may be formed as a recess gate type which extends from the first surface 110F1 of the substrate 110 to an inner portion of the substrate 110.

The wiring layer 134 may be electrically connected to the gate electrode 132 or the active region. The wiring layer 134 may include tungsten, aluminum, copper, tungsten, tungsten silicide, titanium silicide, tungsten nitride, titanium nitride, doped polysilicon, and/or the like. The insulation layer 136 may cover the wiring layer 134 on the first surface 110F1 of the substrate 110. Additionally, the insulation layer 136 may include an insulating material such as silicon oxide, silicon nitride, or silicon oxynitride.

Optionally, a supporting substrate 140 may be disposed on the front side structure 130. An adhesive member (not shown) may be further disposed between the supporting substrate 140 and the front side structure 130.

The pixel separation structure 150 may be disposed to pass through the substrate 110 and may physically and electrically separate one image sensing pixel IPX from an image sensing pixel IPX adjacent thereto. In a plan view, the pixel separation structure 150 may be disposed in a mesh shape or a grid shape. As illustrated in FIG. 4, the pixel separation structure 150 may extend from the first surface 110F1 to the second surface 110F2 of the substrate 110. A width of the pixel separation structure 150 at the same level as the first surface 110F1 of the substrate 110 may be greater than a width of the pixel separation structure 150 at the same level as the second surface 110F2 of the substrate 110. However, the present embodiment is not limited thereto.

The pixel separation structure 150 may include a conductive layer 152 and an insulation liner 154, and the insulation liner 154 may be disposed between the conductive layer 152 and the substrate 110. In embodiments of the present disclosure, the conductive layer 152 may include a conductive material such as polysilicon or a metal. The insulation liner 154 may include a metal oxide such as hafnium oxide, aluminum oxide, or tantalum oxide, and in this case, the insulation liner 154 may act as a negative fixed charge layer. In other embodiments, the insulation liner 154 may include an insulating material such as silicon oxide, silicon nitride, or silicon oxynitride.

A color filter fence 160 may be disposed on the second surface 110F2 of the substrate 110. As exemplarily illustrated in FIG. 5, the color filter fence 160 may have a grid shape or a mesh shape in a plan view, and the color filter fence 160 may be disposed to overlap the pixel separation structure 150 vertically. The color filter fence 160 may define a plurality of color filter spaces 160S where a color filter layer 170 is disposed.

The plurality of color filter spaces 160S may include a first color filter space 160S1 disposed at a position overlapping the plurality of image sensing pixels IPX and a second color filter space 160S2 disposed at a position overlapping the plurality of phase detection shared pixels PPX. A color filter layer 170 corresponding to the plurality of image sensing pixels IPX may be disposed in the first color filter space 160S1. Additionally, a color filter layer 170 corresponding to the plurality of phase detection shared pixels PPX may be disposed in the second color filter space 160S2. The second color filter space 160S2 may be disposed to vertically overlap some or all of the first and second phase detection subpixels PPXa and PPXb. Additionally, the second color filter space 160S2 may have a flat area, where the flat area may be wider than that of the first color filter space 160S1.

The color filter fence 160 may include a barrier metal pattern 162 and a low refractive index material layer pattern 164 disposed on the barrier metal pattern 162. For example, the low refractive index material layer pattern 164 may have a first refractive index which is greater than about 1.0 and is less than or equal to about 1.4. In embodiments of the present disclosure, the low refractive index material layer pattern 164 may include at least one of polymethylmetacrylate (PMMA), silicon acrylate, cellulose acetatebutyrate (CAB), silica, and fluoro-silicon acrylate (FSA). For example, the low refractive index material layer pattern 164 may include a polymer material where silica (SiOx) particles are dispersed.

Light traveling toward the color filter fence 160 may be reflected and directed in a direction toward a center portion of the plurality of image sensing pixels IPX, since the low refractive index material layer pattern 164 has the first refractive index which is relatively low. The color filter fence 160 may prevent light, traveling at an inclined angle to an inner portion of a color filter layer 170 disposed on one image sensing pixel IPX, from entering a color filter layer 170 disposed on an adjacent image sensing pixel IPX. Therefore, preventing interference from occurring between the plurality of image sensing pixels IPX.

The color filter fence 160 may include a first fence part 160I and a second fence part 160P. The first fence part 160I may vertically overlap a boundary between the plurality of image sensing pixels IPX (for example, a portion of the pixel separation structure 150 between the plurality of image sensing pixels IPX). The second fence part 160P may vertically overlap a boundary between one of the plurality of phase detection shared pixels PPX and an image sensing pixel IPX adjacent thereto in the first direction (the X direction). For example, the first color filter space 160S1 may be limited by the first fence part 160I (or, in a plan view, the first color filter space 160S1 may be surrounded by the first fence part 160I), and the second color filter space 160S2 may be limited by the first fence part 160I and the second fence part 160P (or, in a plan view, the second color filter space 160S2 may be surrounded by the first fence part 160I and the second fence part 160P).

The first fence part 160I may have a first width w11 in the first direction (the X direction), and the second fence part 160P may have a second width w12 greater than the first width w11 in the first direction (the X direction). The second width w12 of the second fence part 160P may be 1.5 to 10 times the first width w11, but is not limited thereto. A separation ratio characteristic of a phase difference of the plurality of phase detection shared pixels PPX may be enhanced since the second fence part 160P is formed to have a relatively large width.

Optionally, a rear insulation layer 166 may be disposed between the second surface 110F2 of the substrate 110 and the color filter fence 160. Additionally, a passivation layer 168 may be conformally disposed on an upper surface and a side surface of the color filter fence 160. The rear insulation layer 166 may include a metal oxide, such as hafnium oxide, aluminum oxide, or tantalum oxide, or an insulating material such as silicon oxide, silicon nitride, silicon oxynitride, or a low-k dielectric material. The passivation layer 168 may include an insulating material such as silicon oxide, silicon nitride, silicon oxynitride, or a low-k dielectric material.

The color filter layer 170 filling the color filter space 160S may be disposed on the color filter fence 160 and the passivation layer 168. The color filter layer 170 may sense green light, blue light, and red light based on a kind of material included in the color filter layer 170. Herein, for convenience, a color filter layer 170 for sensing green, a color filter layer 170 for sensing blue, and a color filter layer 170 for sensing red may be respectively referred to as a green color filter layer G, a blue color filter layer B, and a red color filter layer R.

The micro-lens structure 180 may be disposed on the color filter fence 160 and the color filter layer 170. A capping layer 190 may be disposed on the micro-lens structure 180.

The micro-lens structure 180 may include a first micro-lens 182 and a second micro-lens 184. The first micro-lens 182 may be disposed on the plurality of image sensing pixels IPX, and the second micro-lens 184 may be disposed on the plurality of phase detection shared pixels PPX. For example, the second micro-lens 184 may be disposed to vertically overlap some or all of the first and second phase detection subpixels PPXa and PPXb disposed next to each other in the first direction (the X direction). Therefore, the second micro-lens 184 may have a width which is about twice a width of the first micro-lens 182 in the first direction (the X direction).

In embodiments of the present disclosure, a center line of the second micro-lens 184 in the first direction (the X direction) may vertically overlap the pixel separation structure 150. Particularly, a curvature center of the second micro-lens 184 may vertically overlap a portion of the pixel separation structure 150 disposed between the first phase detection subpixel PPXa and the second phase detection subpixel PPXb. Therefore, light incident on a left side with respect to the center line of the second micro-lens 184 may be received by the second phase detection subpixel PPXb, and light incident on a right side may be received by the first phase detection subpixel PPXa. Therefore, a determination of whether an object 2000 (see FIG. 1) is located at an in-focus position may be based on a difference between the amount of light received by the first phase detection subpixel PPXa and the amount of light received by the second phase detection subpixel PPXb.

In embodiments of the present disclosure, the first micro-lens 182 may have a first height h11, and the second micro-lens 184 may have a second height h12, which is greater than the first height h11. In some embodiments, the second height h12 may be about 110% to about 300% of the first height h11, but is not limited thereto. The second height h12 of the second micro-lens 184 may be greater than the first height h11 of the first micro-lens 182. Therefore, the phase detection shared pixel PPX may increase AF separation ratio characteristics.

For example, the phase detection shared pixels PPX may be distributed and disposed in the pixel array PXA. Therefore, in a comparative embodiment, a micro-lens for the image sensing pixel IPX and a micro-lens for the phase detection shared pixel PPX may be formed by the same photoresist patterning process and etch-back process. However, by using the same photoresist patterning process and etch-back process, a micro-lens for the image sensing pixel IPX and a micro-lens for the phase detection shared pixel PPX may be formed to have the same height. For example, in a case where a micro-lens is formed to have a height (or a curvature) for light reception by the image sensing pixel IPX, an AF separation ratio characteristic of the phase detection shared pixel PPX may be reduced by the micro-lens with such a height. For example, in a case where a micro-lens is formed to have a height (or a curvature) for the AF separation ratio characteristic of the phase detection shared pixel PPX, a signal-to-noise ratio (SNR) characteristic of the image sensing pixel IPX may be reduced by the micro-lens with the height.

According to embodiments, the second micro-lens 184 may be formed to have the second height h12 which is greater than a height of the first micro-lens 182. Therefore, the first micro-lens 182 may have a curvature (or a height) optimized for the SNR characteristic of the image sensing pixel IPX and the second micro-lens 184 may have a curvature (or a height) optimized for the AF separation ratio characteristic of the phase detection shared pixel PPX.

Also, as described above, the second fence part 160P of the color filter fence 160 disposed under the second micro-lens 184 may have the second width w12, which is greater than a width of the first fence part 160I of the color filter fence 160 disposed under the first micro-lens 182. A difference between the amount of light incident on the first phase detection subpixel PPXa through the second micro-lens 184 and the amount of light incident on the second phase detection subpixel PPXb through the second micro-lens 184 may increase, for example, the AF separation ratio characteristic may be enhanced, since the second fence part 160P is formed to a relatively large width.

As exemplarily illustrated in FIGS. 3 and 5, the plurality of image sensing pixels IPX may include a plurality of image sensing shared pixels SIPX. For example, the plurality of image sensing shared pixels SIPX may include two pixels adjacent to each other in the first direction and two pixels adjacent to each other in the second direction. For example, in FIG. 3, one image sensing shared pixel SIPX may include first to fourth image sensing subpixels IPX1 to IPX4 arranged in a 2×2 matrix form. However, the inventive concept is not limited thereto, and one image sensing shared pixel SIPX may include nine subpixels arranged in a 3×3 matrix form or may include sixteen subpixels arranged in a 4×4 matrix form.

The color filter layer 170 for sensing the same color may be disposed on the first to fourth image sensing subpixels IPX1 to IPX4 included in one image sensing shared pixel SIPX. For example, a green color filter layer G may be disposed on the first to fourth image sensing subpixels IPX1 to IPX4 illustrated by a dashed line in FIG. 3. For example, a blue color filter layer B and the green color filter layer G may be alternately disposed on a plurality of image sensing shared pixels SIPX arranged in the first direction (the X direction). The blue color filter layer B and the green color filter layer G may be alternately disposed on a plurality of image sensing shared pixels SIPX arranged in the second direction (the Y direction). However, the color arrangement of the color filter layer 170 is not limited to the above description. In other embodiments, at least a portion of the green color filter layer G may be replaced by a color filter layer 170, which senses white.

In one shared pixel SIPX_B illustrated in FIG. 5, the blue color filter layer B may be disposed in the first color filter space 160S1 limited by the first fence part 160I of the color filter fence 160. For example, in the one shared pixel SIPX_B, the blue color filter layer B may be disposed on each of first to fourth image sensing subpixels IPX1 to IPX4, and in one shared pixel SIPX_G adjacent thereto, the green color filter layer G may be disposed on each of first to fourth image sensing subpixels IPX1 to IPX4.

In one phase detection shared pixel PPX illustrated in FIG. 4, the green color filter layer G may be disposed in the second color filter space 160S2 limited by the first fence part 160I and the second fence part 160P of the color filter fence 160. In other embodiments, the color filter layer 170 for sensing white may be disposed on a plurality of phase detection shared pixels PPX. In other embodiments, the green color filter layer G may be disposed on some of a plurality of phase detection shared pixels PPX, and the color filter layer 170 for sensing white may be disposed on some other phase detection shared pixels PPX.

The phase detection shared pixel PPX may be disposed at a position of a subpixel of two adjacent image sensing shared pixels SIPX. Therefore, each of peripheral shared pixels SIPX_P1 and SIPX_P2 disposed adjacent to the phase detection shared pixel PPX may include first to third image sensing subpixels IPX1 to IPX3. For example, the peripheral shared pixel SIPX_P1 disposed at a left side of the phase detection shared pixel PPX illustrated in FIG. 5 may be configured with three subpixels corresponding to the blue color filter layer B. Additionally, the peripheral shared pixel SIPX_P2 disposed at a right side of the phase detection shared pixel PPX may be configured with three subpixels corresponding to a red color filter layer R. However, the arrangement of the phase detection shared pixel PPX is not limited thereto.

In embodiments of the present disclosure, in a low illumination operation mode, control may be performed to generate a pixel signal by sensing light through a plurality of photoelectric conversion regions 120 of a plurality of image sensing shared pixels SIPX. Also, in a high illumination operation mode, control may be performed to individually generate a pixel signal based on each of image sensing subpixels IPX1 to IPX4 of the plurality of image sensing shared pixels SIPX. For example, under a low illumination condition, a pixel signal may be generated based on one unit including some or all of four image sensing subpixels IPX1 to IPX4. Under a high-resolution condition, a pixel signal may be generated based on one unit including each of four image sensing subpixels IPX1 to IPX4. Therefore, even when a light-receiving capacity (or a light receiving area) of one subpixel is reduced because a size of a unit pixel is reduced based on the scale-down of the image sensor 100, a wide dynamic range may be secured.

Also, according to the image sensor 100 described above, the second micro-lens 184 may be formed to have the second height h12, which is greater than the first height h11 of the first micro-lens 182. Therefore, the first micro-lens 182 may have a curvature (or a height) optimized for the SNR characteristic of the image sensing pixel IPX and the second micro-lens 184 may have a curvature (or a height) optimized for the AF separation ratio characteristic of the phase detection shared pixel PPX. Also, the second width w12 of the second fence 160P of the color filter fence 160 may be set to be greater than the first width w11 of the first fence part 160I. Therefore, the AF separation ratio characteristic of the phase detection shared pixel PPX may be enhanced. Therefore, the image sensor 100 may quickly and accurately perform the AF function and may enhance a sensitivity of an image sensing pixel.

Figure 7:
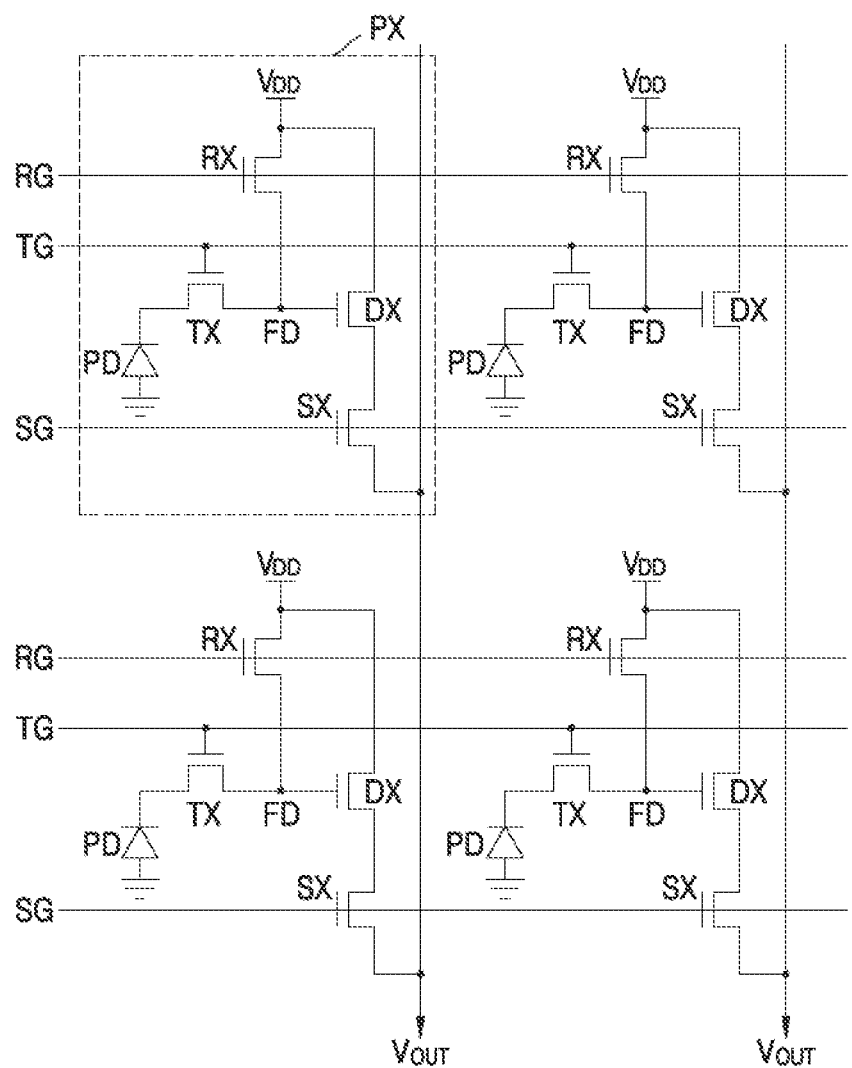
FIG. 7 is an equivalent circuit diagram of a plurality of pixels of an image sensor according to embodiments.

FIG. 7 is an equivalent circuit diagram of a plurality of pixels PX of an image sensor 100 according to embodiments.

Referring to FIG. 7, the plurality of pixels PX may be arranged in a matrix form. Each of the plurality of pixels PX may include a transmission transistor TX and a plurality of logic transistors. Here, the logic transistors may include a reset transistor RX, a selection transistor SX, and a drive transistor DX (or a source follower transistor). The reset transistor RX may include a reset gate RG, the selection transistor SX may include a selection gate SG, and the transmission transistor TX may include a transmission gate TG.

Each of the plurality of pixels PX may further include a photoelectric conversion device PD and a floating diffusion region FD. The photoelectric conversion device PD may correspond to the photoelectric conversion region 120 described above with reference to FIGS. 3 to 6. The photoelectric conversion device PD may generate and accumulate photoelectric charges in proportion to the amount of light incident from the outside and may use a photodiode, a phototransistor, a photogate, a pinned photodiode (PPD), and a combination thereof.

The transmission gate TG may transmit a photoelectric charge, generated by the photoelectric conversion device PD, to the floating diffusion region FD. The floating diffusion region FD may receive, accumulate, and store the photoelectric charge generated by the photoelectric conversion device PD. The drive transistor DX may be controlled based on the amount of photoelectric charges accumulated into the floating diffusion region FD.

The reset transistor RX may periodically reset photoelectric charges accumulated into the floating diffusion region FD. A drain electrode of the reset transistor RX may be connected to the floating diffusion region FD, and a source electrode thereof may be connected to a source voltage $V_{DD}$. When the reset transistor RX is turned on, the source voltage $V_{DD}$ connected to the source electrode of the reset transistor RX may be transferred to the floating diffusion region FD. When the reset transistor RX is turned on, the photoelectric charges accumulated into the floating diffusion region FD may be discharged. Therefore, the floating diffusion region FD may be reset.

The drive transistor DX may be connected to a current source (not shown) disposed outside the plurality of pixels PX and may act as a source follower buffer amplifier, and moreover, the drive transistor DX may amplify an electric potential variation in the floating diffusion region FD and may output the amplified electric potential variation to an output line VOUT The selection transistor SX may select the plurality of pixels PX by units of rows, and when the selection transistor SX is turned on, the source voltage $V_{DD}$ may be transferred to a source electrode of the drive transistor DX.

Figure 8:
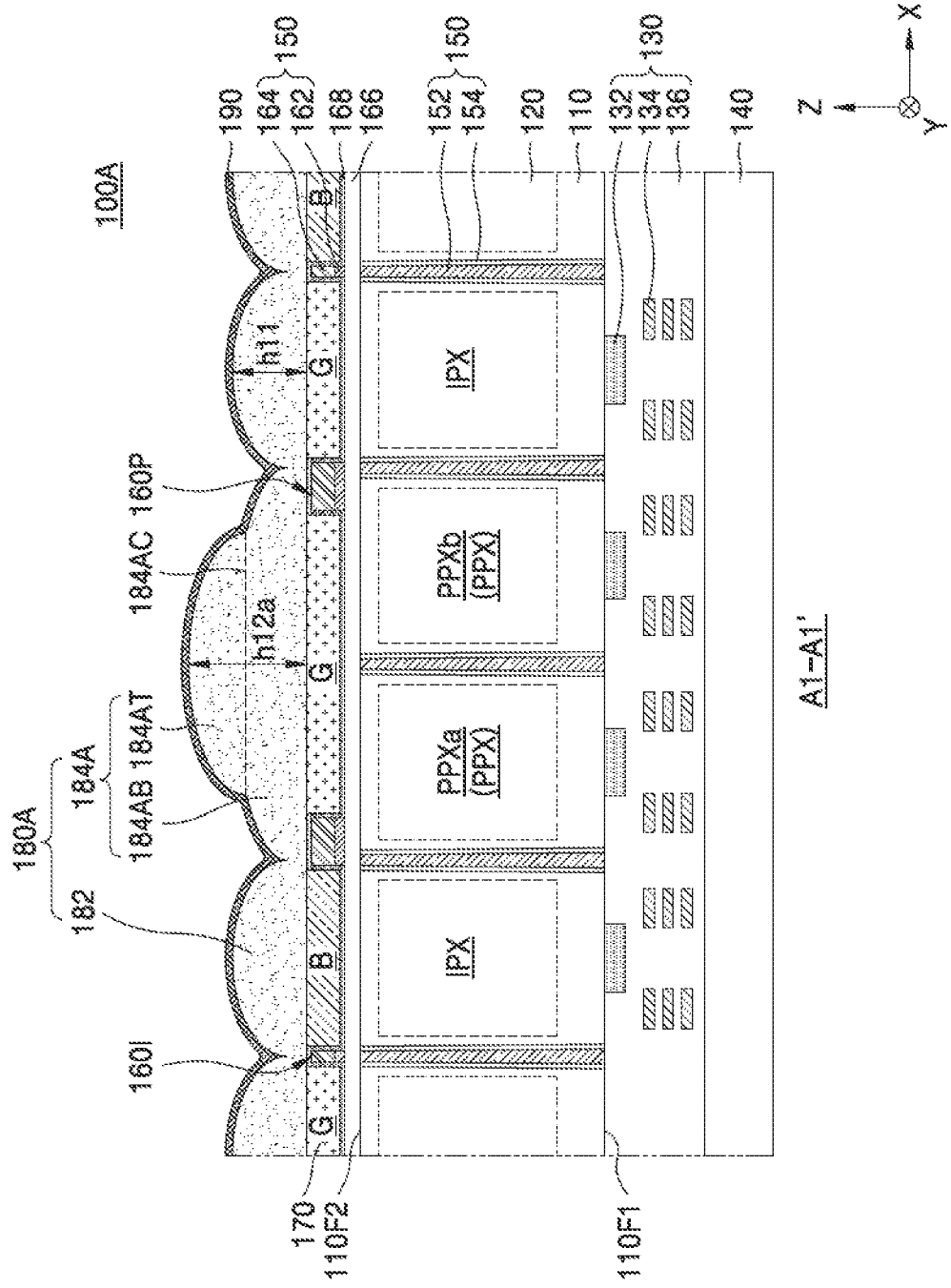
FIG. 8 is a cross-sectional view illustrating an image sensor according to embodiments.
Figure 9:
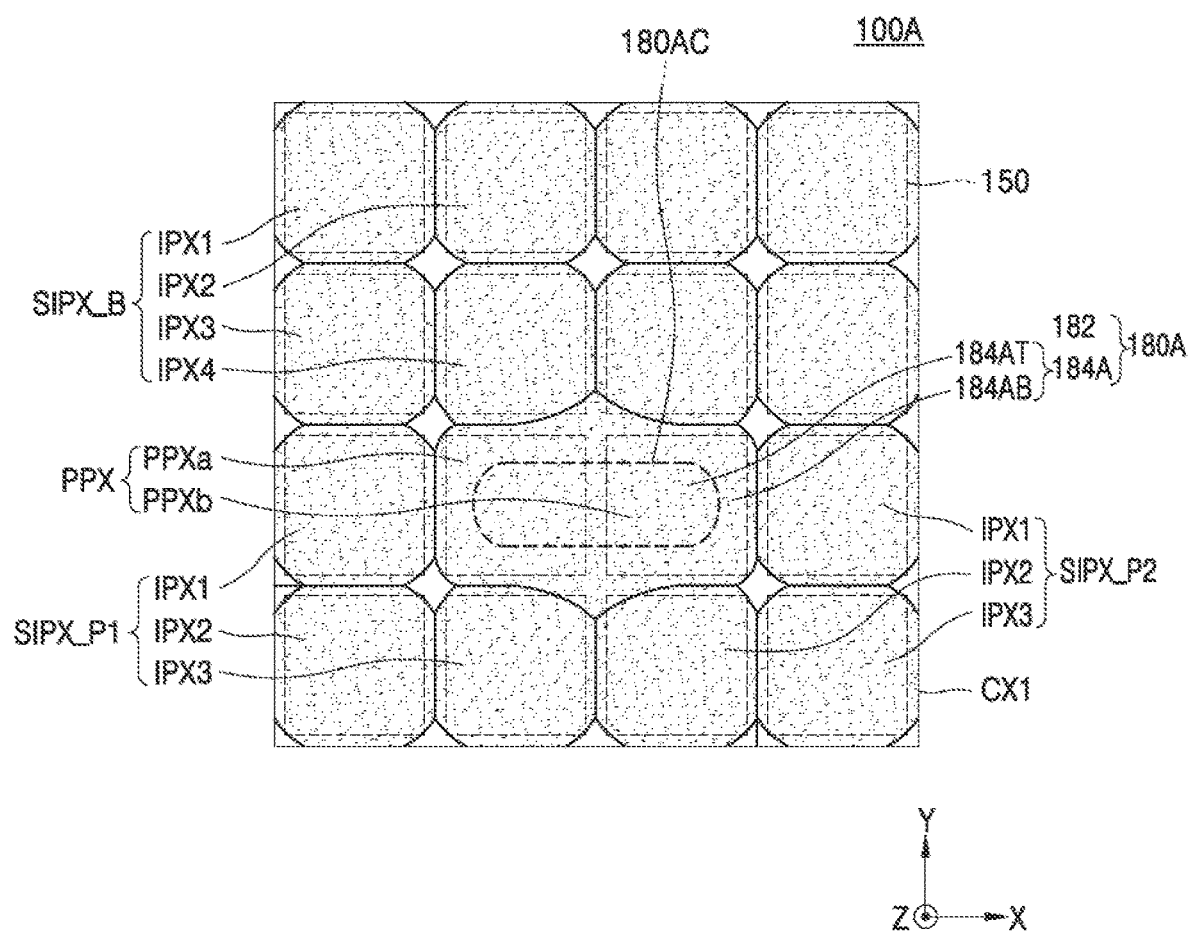
FIG. 9 is a horizontal cross-sectional view of a region corresponding to CX1 of FIG. 3.

FIG. 8 is a cross-sectional view illustrating an image sensor 100A according to embodiments, and FIG. 9 is a horizontal cross-sectional view of a region corresponding to CX1 of FIG. 3. In FIGS. 8 and 9, the same reference numerals as those of FIGS. 1 to 7 refer to like elements.

Referring to FIGS. 8 and 9, a micro-lens structure 180A may include a first micro-lens 182 and a second micro-lens 184A, and the second micro-lens 184A may include a bottom micro-lens part 184AB and a top micro-lens part 184AT. The bottom micro-lens part 184AB may be disposed on a color filter fence 160 and a color filter layer 170, and the top micro-lens part 184AT may be disposed on the bottom micro-lens part 184AB.

In embodiments of the present disclosure, the bottom micro-lens part 184AB and the top micro-lens part 184AT may be provided as one body and may be configured as one material layer. The bottom micro-lens part 184AB and the top micro-lens part 184AT may be portions of a semispherical structure with different curvature radii (or curvature centers). A boundary line 184AC between the bottom micro-lens part 184AB and the top micro-lens part 184AT may correspond to a connection line between points at which a curvature of the second micro-lens 184A varies rapidly. Additionally, a portion of the second micro-lens 184A on the boundary line 184AC may be referred to as the top micro-lens part 184AT. A portion of the second micro-lens 184A under the boundary line 184AC may also be referred to as the bottom micro-lens part 184AB. As illustrated in FIG. 9, the top micro-lens part 184AT may have a semispherical shape that extends in a first direction (an X direction). In a plan view, the boundary line 184AC may have an oval shape that extends in the first direction (the X direction).

In embodiments of the present disclosure, the second micro-lens 184A may have a second height h12a, which is greater than a first height h11 of the first micro-lens 182. Therefore, the first micro-lens 182 may have a curvature (or a height) optimized for an SNR characteristic of an image sensing pixel IPX and the second micro-lens 184A may have a curvature (or a height) optimized for an AF separation ratio characteristic of a phase detection shared pixel PPX. Also, the second micro-lens 184A may be provided to include the bottom micro-lens part 184AB and the top micro-lens part 184AT with different curvatures. Therefore, the second micro-lens 184A may have a characteristic optimized for the AF separation ratio characteristic of the phase detection shared pixel PPX.

Figure 10:
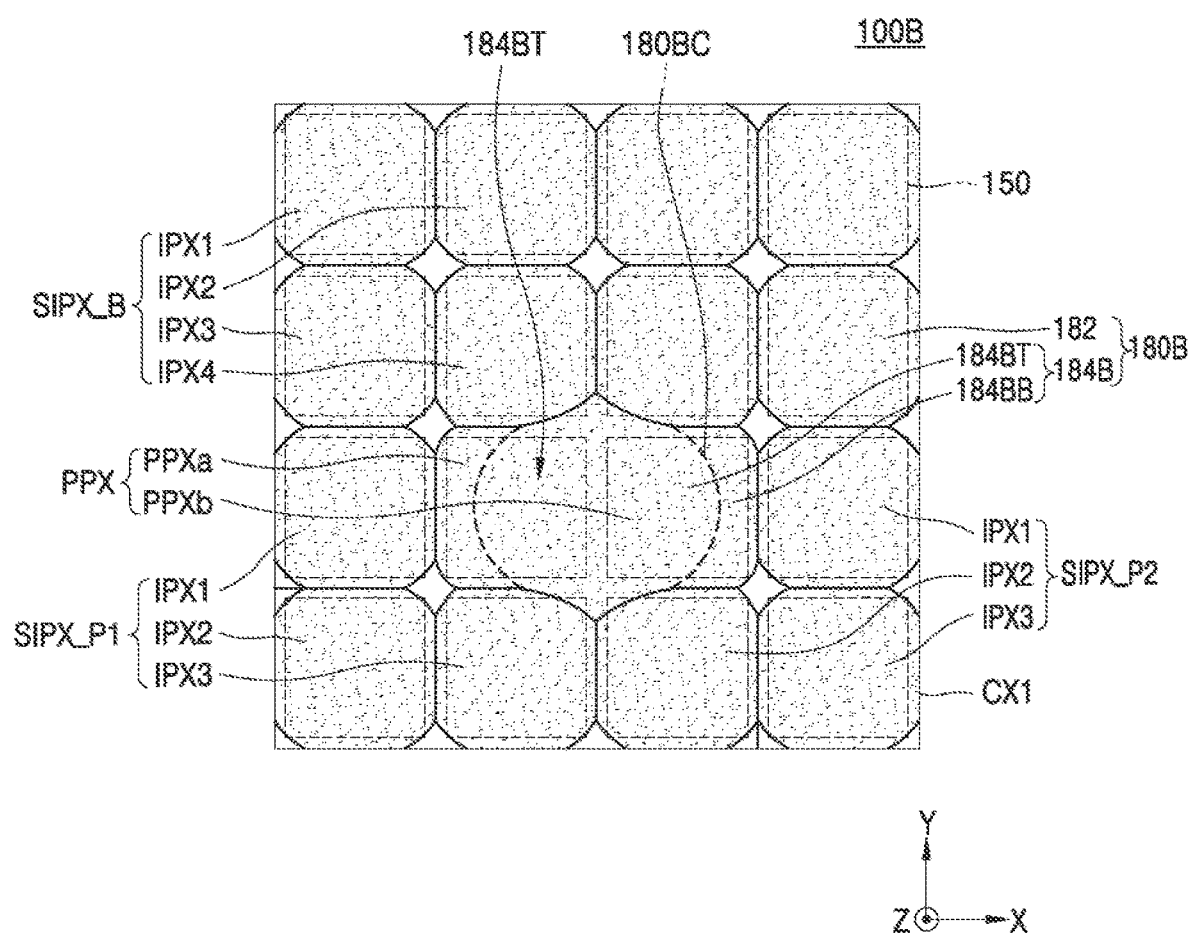
FIG. 10 is a cross-sectional view illustrating an image sensor according to embodiments.

FIG. 10 is a cross-sectional view illustrating an image sensor 100B according to embodiments. FIG. 10 is a plan view of a region corresponding to CX1 of FIG. 3. In FIG. 10, the same reference numerals as those of FIGS. 1 to 9 refer to like elements.

A micro-lens structure 180B may include a first micro-lens 182 and a second micro-lens 184B, and the second micro-lens 184B may include a bottom micro-lens part 184BB and a top micro-lens part 184BT. The bottom micro-lens part 184BB and the top micro-lens part 184BT may be portions of a semispherical structure with different curvature radii (or curvature centers). As illustrated in FIG. 10, the top micro-lens part 184bT may have a semispherical shape where a width thereof in a second direction (a Y direction) is similar to a width thereof in a first direction (an X direction). In a plan view, a boundary line 184BC may include a portion overlapping a first phase detection subpixel PPXa and a portion overlapping a second phase detection subpixel PPXb. The second micro-lens 184B may have a shape or a curvature (or a height) optimized for an AF separation ratio characteristic of a phase detection shared pixel PPX.

Figure 11:
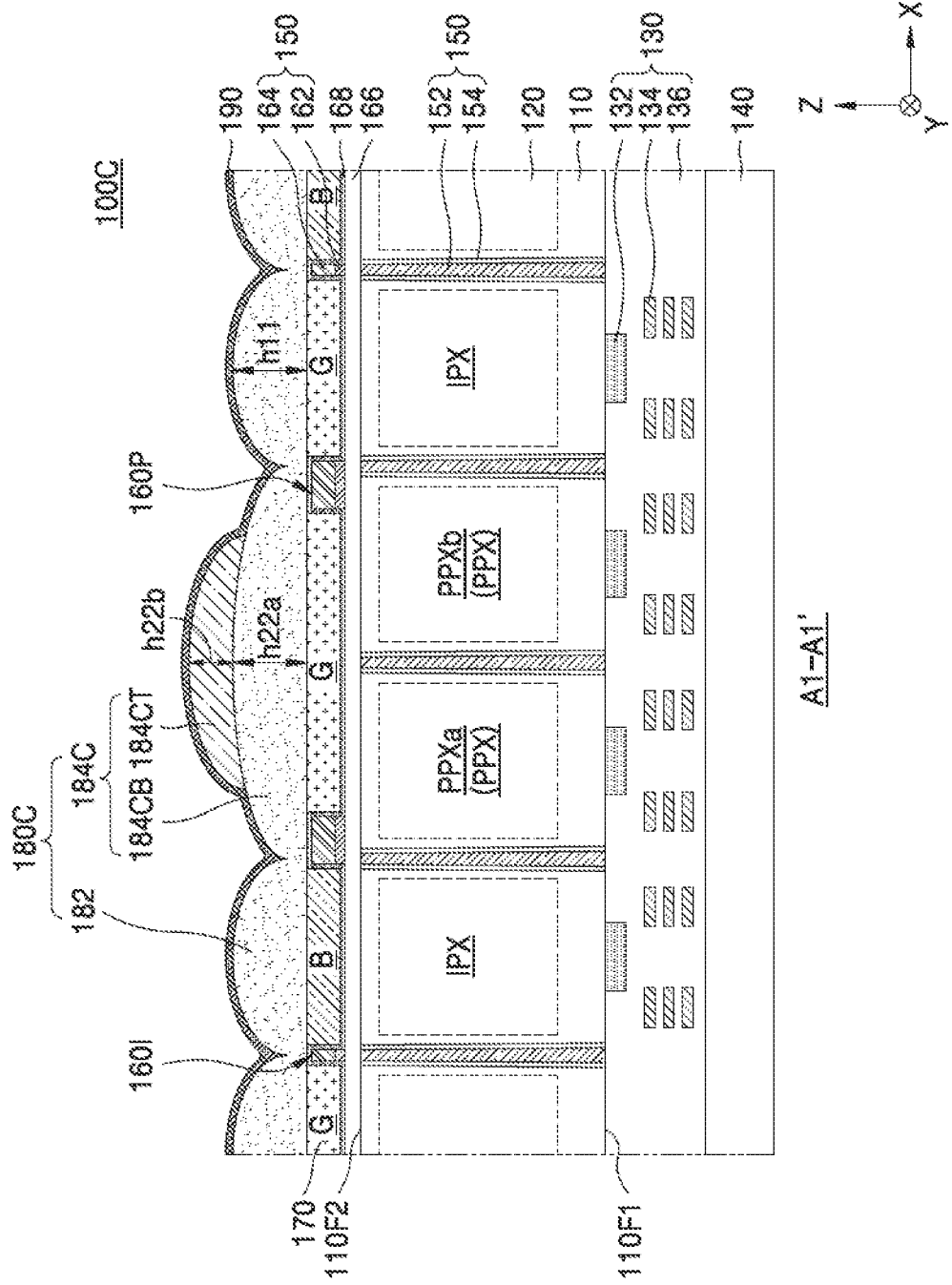
FIG. 11 is a cross-sectional view illustrating an image sensor according to embodiments.

FIG. 11 is a cross-sectional view illustrating an image sensor 100C according to embodiments. FIG. 11 is a cross-sectional view of a region corresponding to a line A1-A1' of FIG. 3. In FIG. 11, the same reference numerals as those of FIGS. 1 to 10 refer to like elements.

Referring to FIG. 11, a micro-lens structure 180C may include a first micro-lens 182 and a second micro-lens 184C, and the second micro-lens 184C may include a bottom micro-lens part 184CB and a top micro-lens part 184CT. The bottom micro-lens part 184CB and the top micro-lens part 184CT may include different materials.

For example, the bottom micro-lens part 184CB may include a light-transmitting organic material, and the top micro-lens part 184CT may include a photoresist material. The bottom micro-lens part 18CB may be formed by etching back a light-transmitting organic material, and the top micro-lens part 184CT may be formed by reflowing a photoresist material.

In embodiments of the present disclosure, the first micro-lens 182 may have a first height h11, the bottom micro-lens part 184CB may have a second height h22a, and the top micro-lens part 184CT may have a third height h22b. The second height h22a may be substantially the same as or similar to the first height h11, but is not limited thereto.

Figure 12:
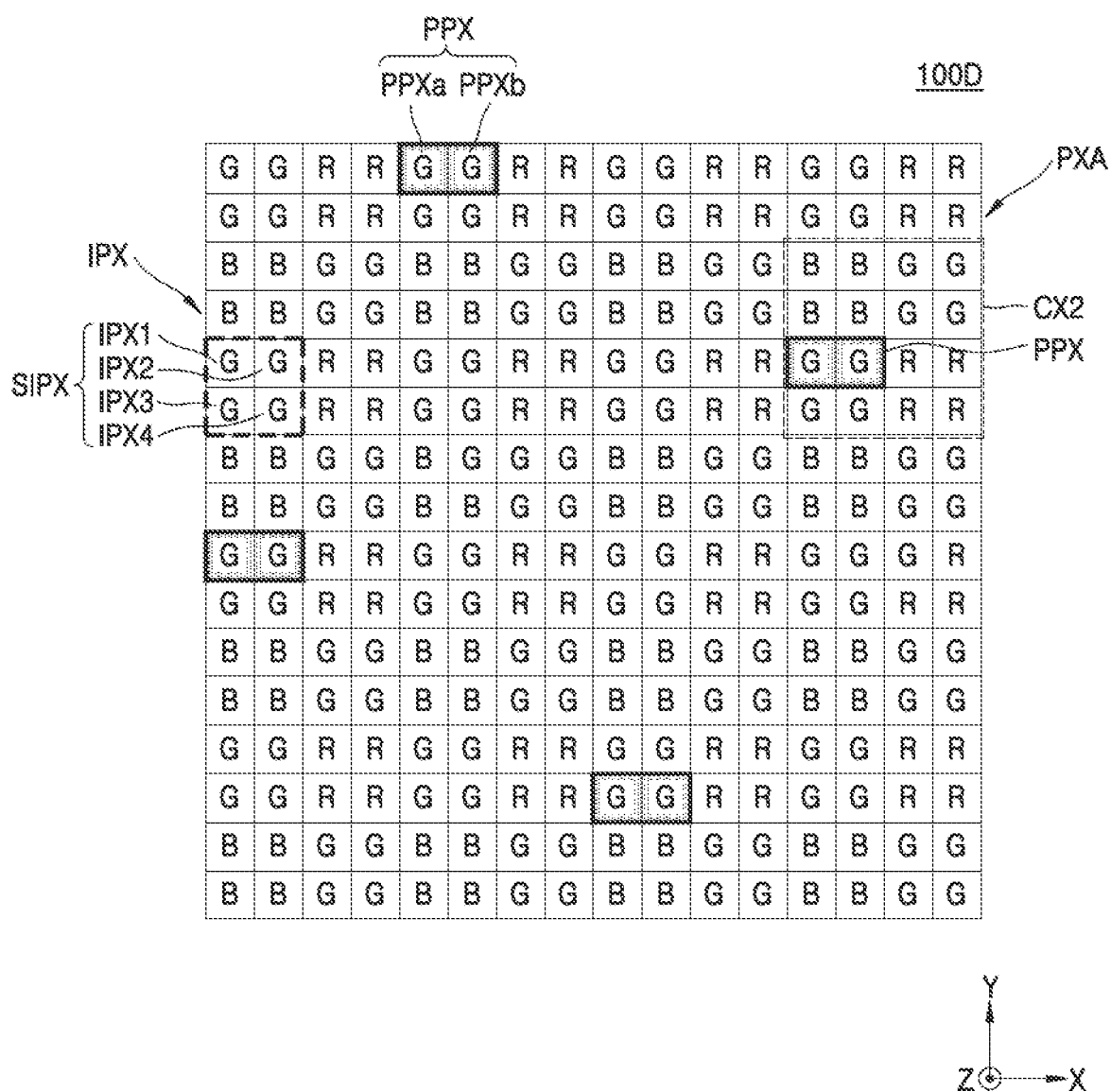
FIG. 12 is a layout view illustrating an image sensor according to embodiments.
Figure 13:
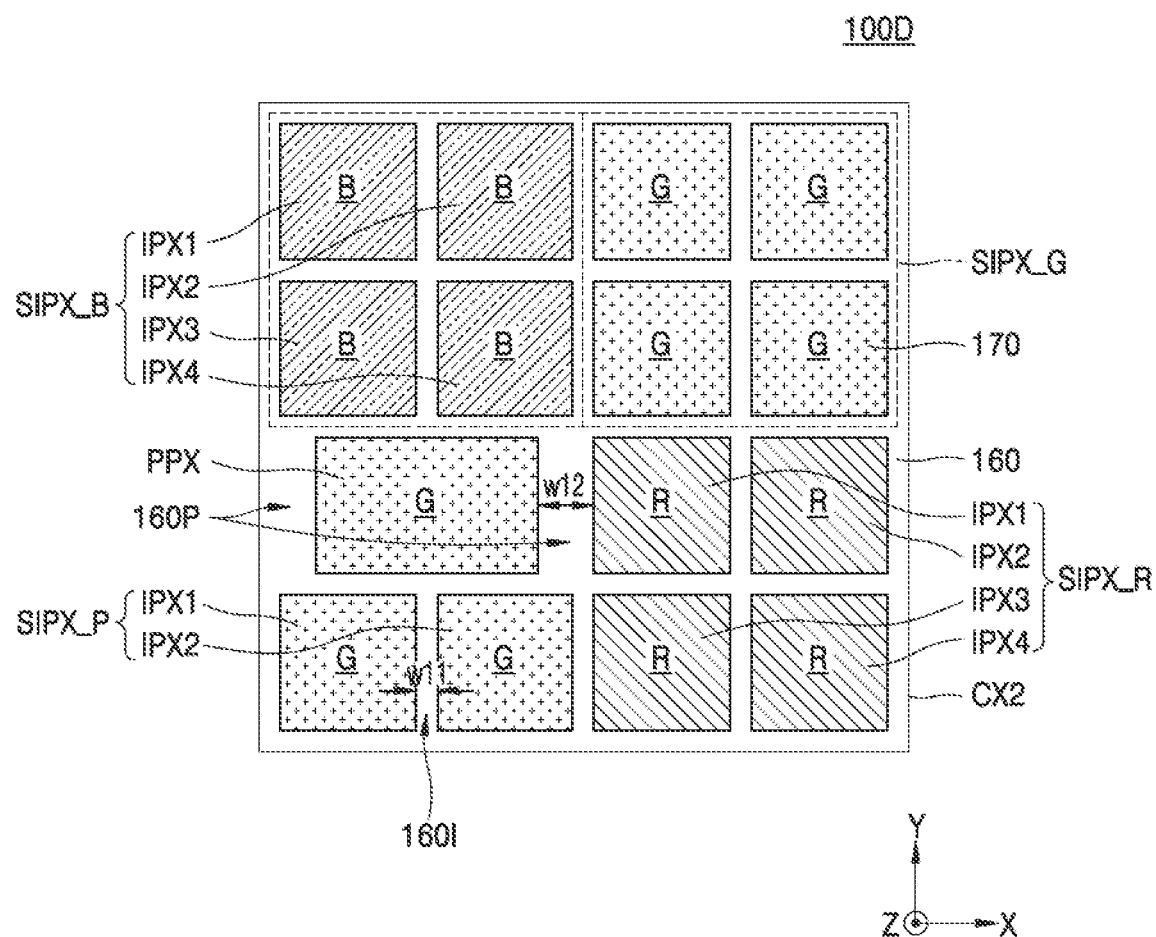
FIG. 13 is a plan view of a region CX2 of FIG. 12.

FIG. 12 is a layout view illustrating an image sensor 100D according to embodiments, and FIG. 13 is a plan view of a region CX2 of FIG. 12. In FIGS. 12 and 13, the same reference numerals as those of FIGS. 1 to 11 refer to like elements.

Referring to FIGS. 12 and 13, a phase detection shared pixel PPX may be disposed at a position of a subpixel of one image sensing shared pixel SIPX. Therefore, a peripheral shared pixel SIPX_P disposed adjacent to the phase detection shared pixel PPX may include first and second image sensing subpixels IPX1 and IPX2. For example, a shared pixel SIPX_P disposed under the phase detection shared pixel PPX, illustrated in FIG. 13, may be configured with two subpixels (or where a green color filter layer G is provided thereon) corresponding to the green color filter layer G. One shared pixel SIPX_R disposed at a right side of the phase detection shared pixel PPX may be configured with four subpixels corresponding to a red color filter layer R. However, the arrangement of the phase detection shared pixel PPX is not limited thereto.

Figure 14:
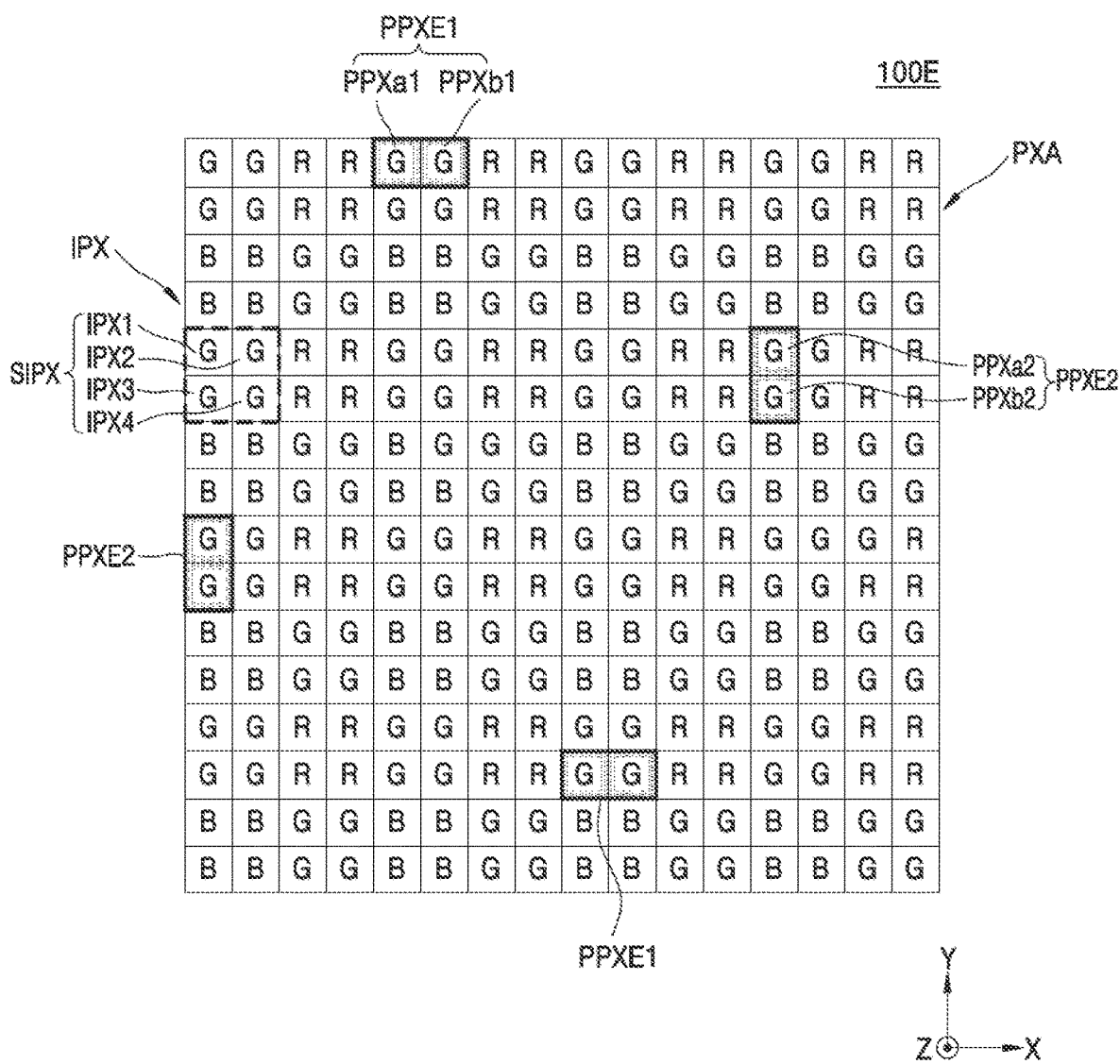
FIG. 14 is a layout view illustrating an image sensor according to embodiments.

FIG. 14 is a layout view illustrating an image sensor 100E according to embodiments.

Referring to FIG. 14, a first phase detection shared pixel PPXE1 may include first and second phase detection subpixels PPXa1 and PPXb1 disposed next to each other in a first direction (an X direction). Additionally, the first phase detection shared pixel PPXE1 may include a second phase detection shared pixel PPXE2 may include third and fourth phase detection subpixels PPXa2 and PPXb2 disposed next to each other in a second direction (a Y direction).

In some embodiments, the first phase detection shared pixel PPXE1 may be controlled to calculate an in-focus position in a horizontal direction (e.g., the X-direction), and the second phase detection shared pixel PPXE2 may be controlled to calculate an in-focus position in a vertical direction (e.g., the Y direction). A plurality of first phase detection shared pixels PPXE1 and a plurality of second phase detection shared pixels PPXE2 may be randomly distributed and arranged. The number of first phase detection shared pixels PPXE may be the same as the number of second phase detection shared pixels PPXE2. In other embodiments, the number and arrangement of first phase detection shared pixels PPXE and the number and arrangement of second phase detection shared pixels PPXE2 may be modified.

FIGS. 15 to 25 are cross-sectional views illustrating a method of manufacturing an image sensor 100 according to embodiments. FIGS. 15 to 25 illustrate, in a process sequence, cross-sectional surfaces corresponding to a cross-sectional surface taken along line A1-A1' of FIG. 3. In FIGS. 15 to 25, the same reference numerals as those of FIGS. 1 to 14 refer to like elements.

Figure 15:
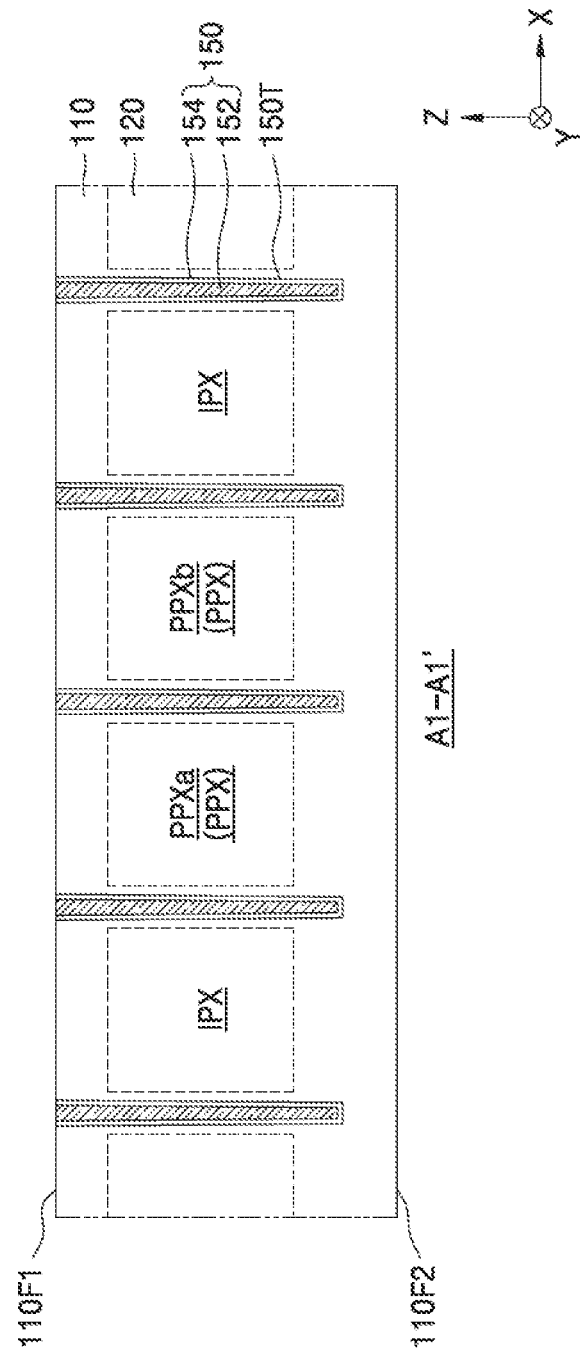
FIGS. 15 to 25 are cross-sectional views illustrating a method of manufacturing an image sensor, according to embodiments.

Referring to FIG. 15, a substrate 110 including a first surface 110F1 and a second surface 110F2 opposite to each other may be provided. A mask pattern (not shown) may be formed on the first surface 110F1 of the substrate 110. A trench 150T may be formed by removing a portion of the substrate 110 from the first surface 110F1 of the substrate 110 by using the mask pattern.

Subsequently, an insulation liner 154 and a conductive layer 152 may be sequentially formed in the trench 150T. A pixel separation structure 150 may be formed in the trench 150T by removing the insulation liner 154 and the conductive layer 152 portion disposed on the first surface 110F1 of the substrate 110 through a planarization process.

Subsequently, a photoelectric conversion region 120 including a photodiode region (not shown) and a well region (not shown) may be formed from the first surface 110F1 of the substrate 110 by an ion implantation process. For example, the photodiode region may be formed by doping N-type impurities, and the well region may be formed by doping P-type impurities.

Figure 16:
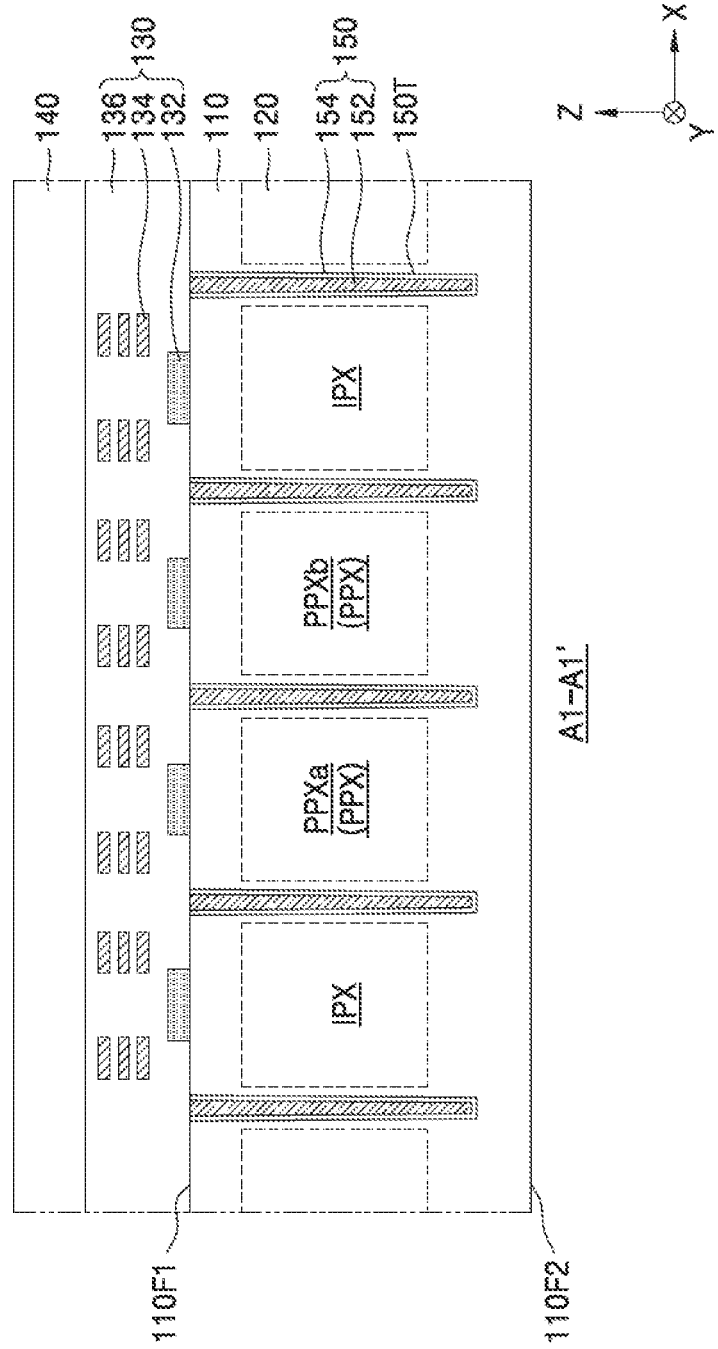

Referring to FIG. 16, a front side structure 130 may be formed on the first surface 110F1 of the substrate 110. First, a gate electrode 132 may be formed on the first surface 110F1 of the substrate 110. Then, a floating diffusion region (not shown) and an active region (not shown) may be formed in a partial region of the first surface 110F1 of the substrate 110 by performing an ion implantation process. Next, a wiring layer 134 and an insulation layer 136 may be formed on the substrate 110 by repeatedly performing an operation of forming a conductive layer (not shown) on the first surface 110F1 of the substrate 110, an operation of patterning the conductive layer, and an operation of forming an insulation layer (not shown) to cover the patterned conductive layer.

Subsequently, a supporting substrate 140 may be attached on the insulation layer 136.

Figure 17:
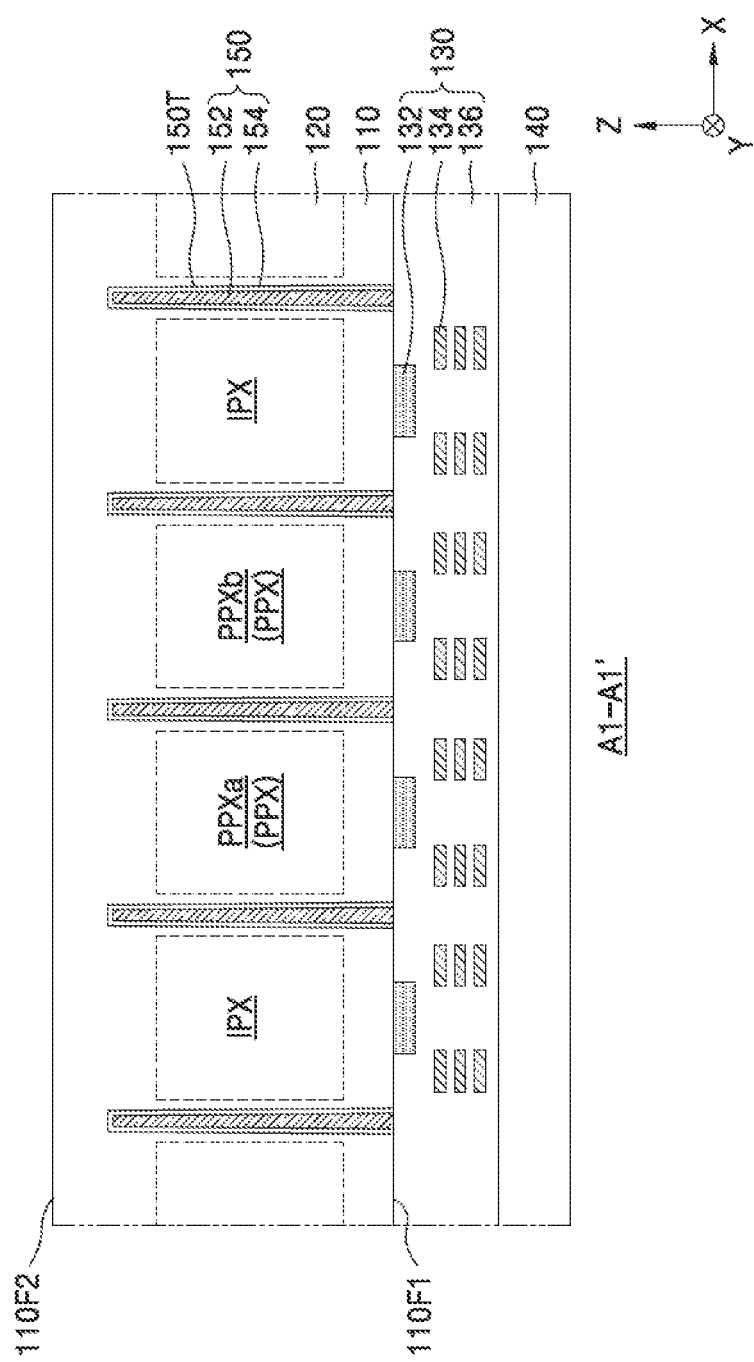

Referring to FIG. 17, the substrate 110 may be overturned so that the second surface 110F2 of the substrate 110 faces upward. Here, a bottom surface of the trench 150T may be in a state which is not exposed at the second surface 110F2 of the substrate 110.

Figure 18:
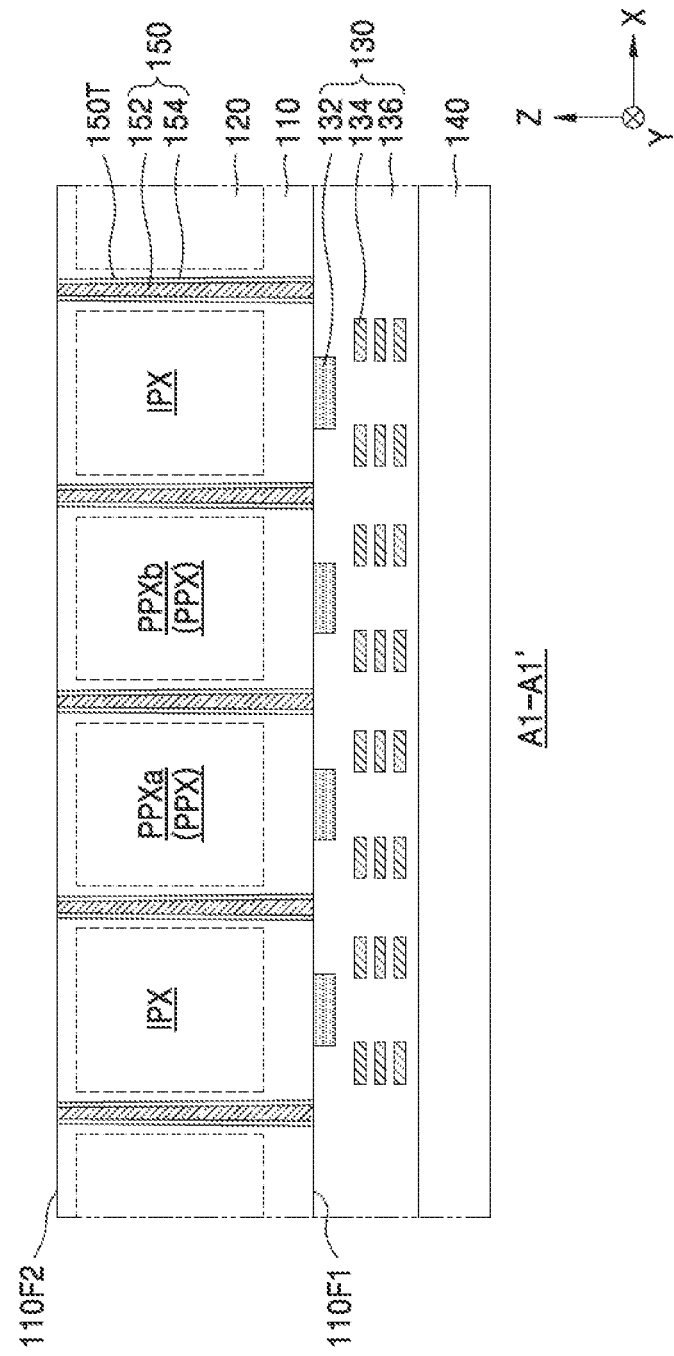

Referring to FIG. 18, a portion of the substrate 110 may be removed from the second surface 110F2 of the substrate 110 through a planarization process such as a chemical mechanical planarization (CMP) process or an etch-back process so that the conductive layer 152 is exposed. As such a removal process is performed, a level of the second surface 110F2 of the substrate 110 may be lowered. At this time, one image sensing pixel IPX surrounded by the pixel separation structure 150 may be physically and electrically separated from an image sensing pixel IPX adjacent thereto.

Figure 19:
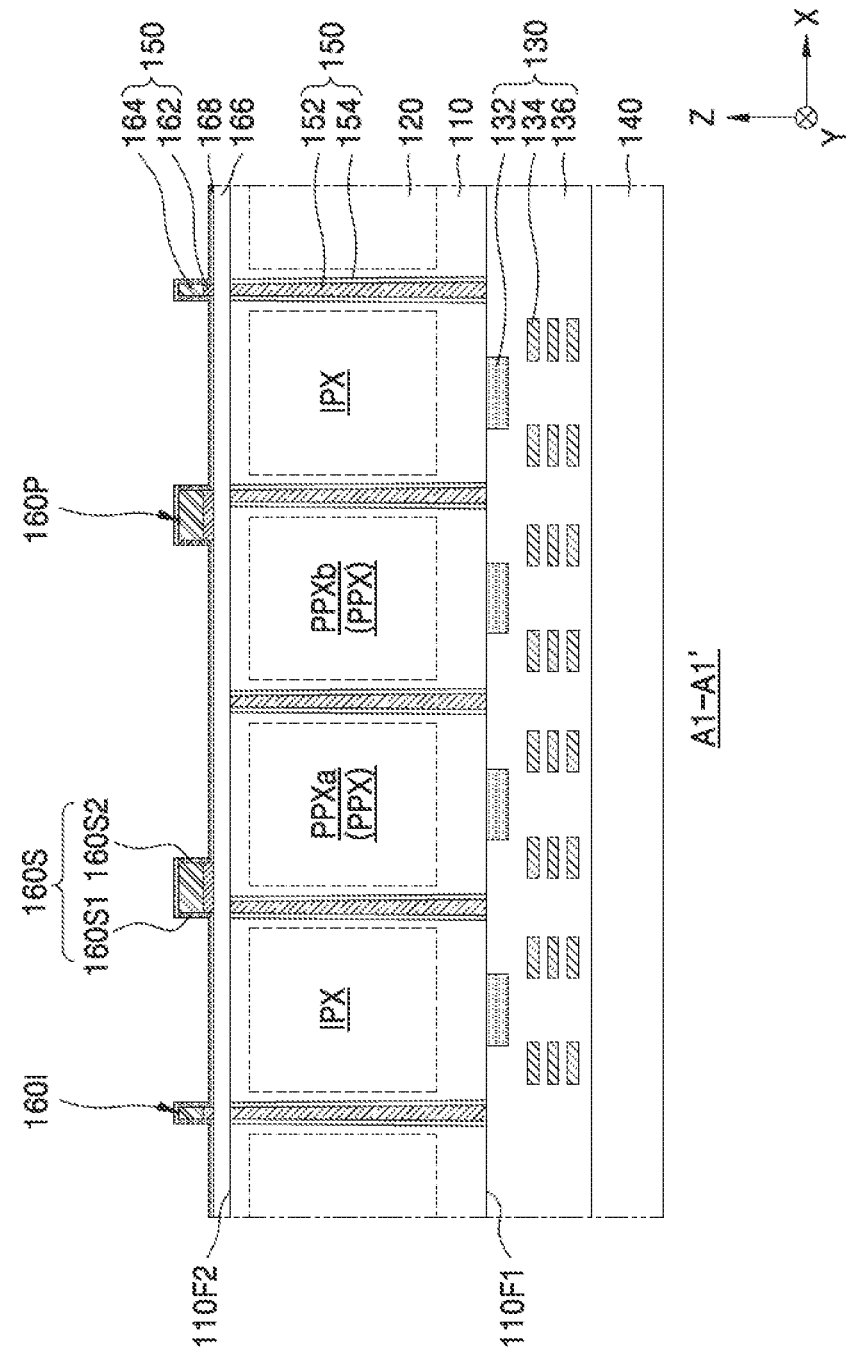

Referring to FIG. 19, a rear insulation layer 166 may be formed on the second surface 110F2 of the substrate 110.

Subsequently, a barrier metal layer (not shown) and a low refractive index material layer (not shown) may be sequentially formed on the rear insulation layer 166, and a barrier metal pattern 162 and a low refractive index material layer pattern 164 may be formed by patterning the barrier metal layer and the low refractive index material layer. The barrier metal pattern 162 and the low refractive index material layer pattern 164 may be referred to as a color filter fence 160, and in a plan view, may each have a grid shape and may vertically overlap the pixel separation structure 150.

In the patterning process, the color filter fence 160 may be patterned to include a first fence part 160I with a relatively small width and a second fence part 160P with a relatively large width. Here, a color filter space 160S may be defined by the color filter fence 160, a first color filter space 160S1 may overlap an image sensing pixel IPX, and a second color filter space 160S2 may overlap a phase detection shared pixel PPX.

Subsequently, a passivation layer 168 may be conformally formed on an inner wall of the color filter space 160S.

Figure 20:
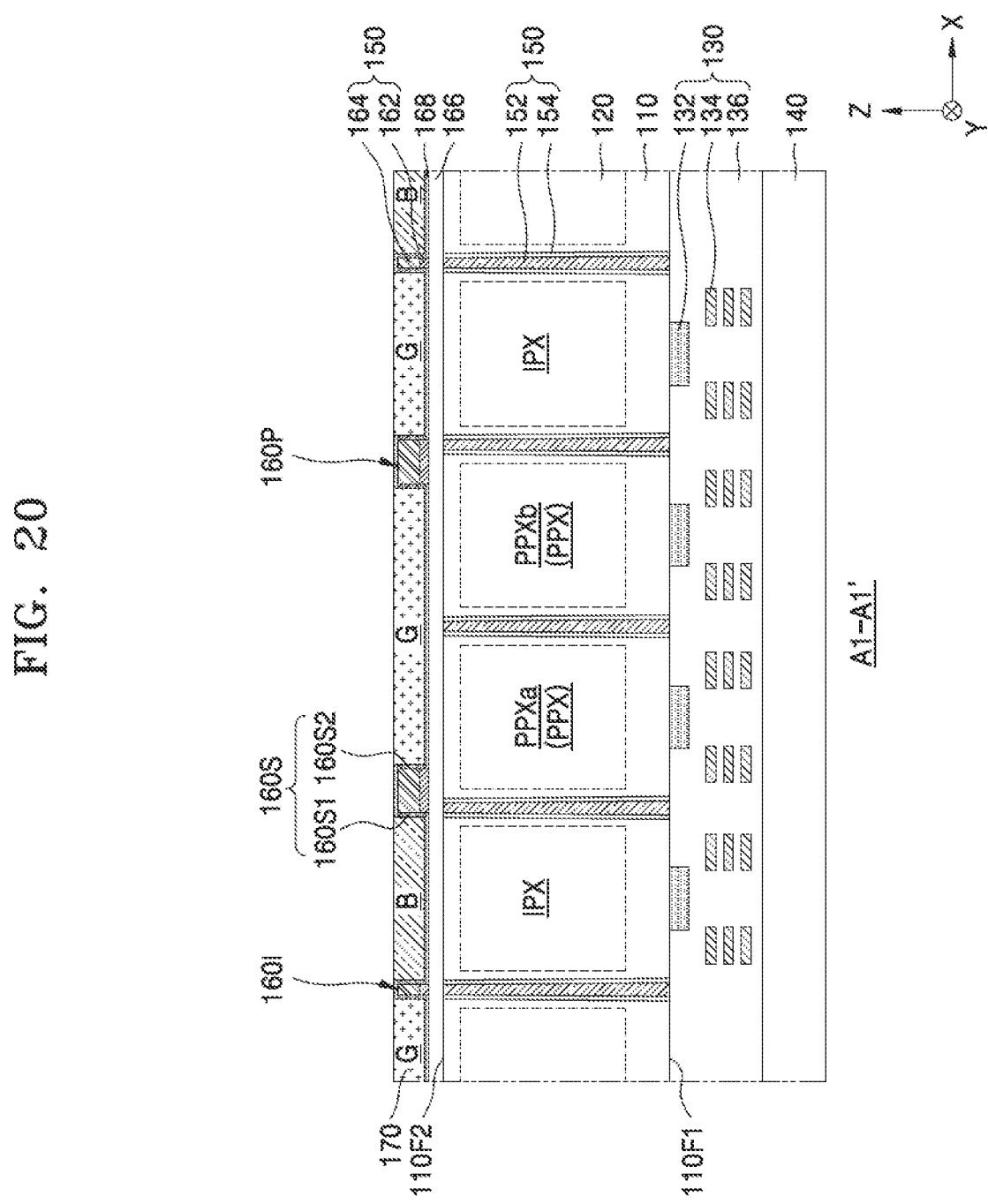

Referring to FIG. 20, a color filter layer 170 may be formed in the color filter space 160S.

Figure 21:
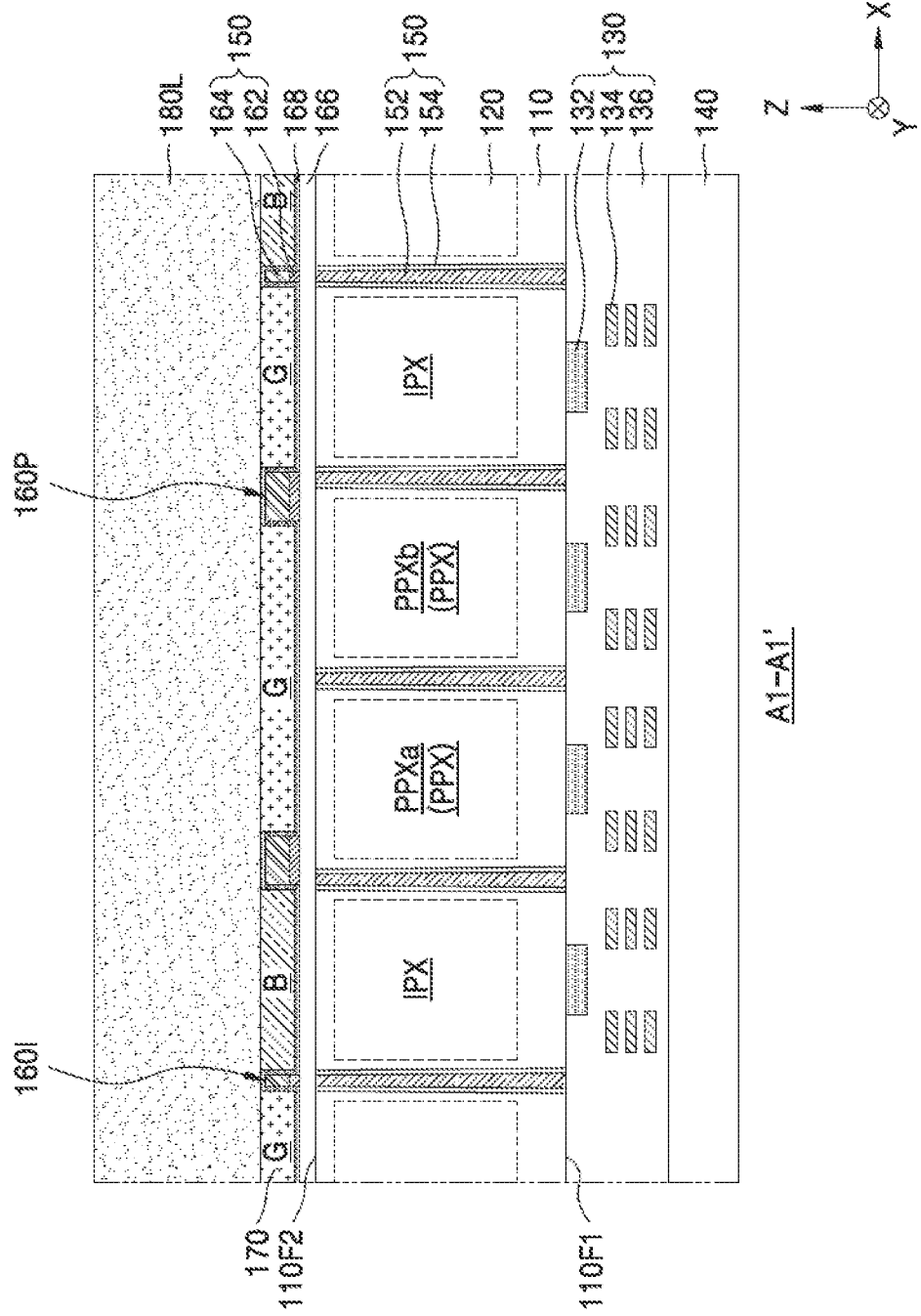

Referring to FIG. 21, a micro-lens material layer 180L may be formed on the color filter layer 170. For example, the micro-lens material layer 180L may be formed of a light-transmitting organic material through a spin coating process, a chemical vapor deposition (CVD) process, or the like.

Figure 22:
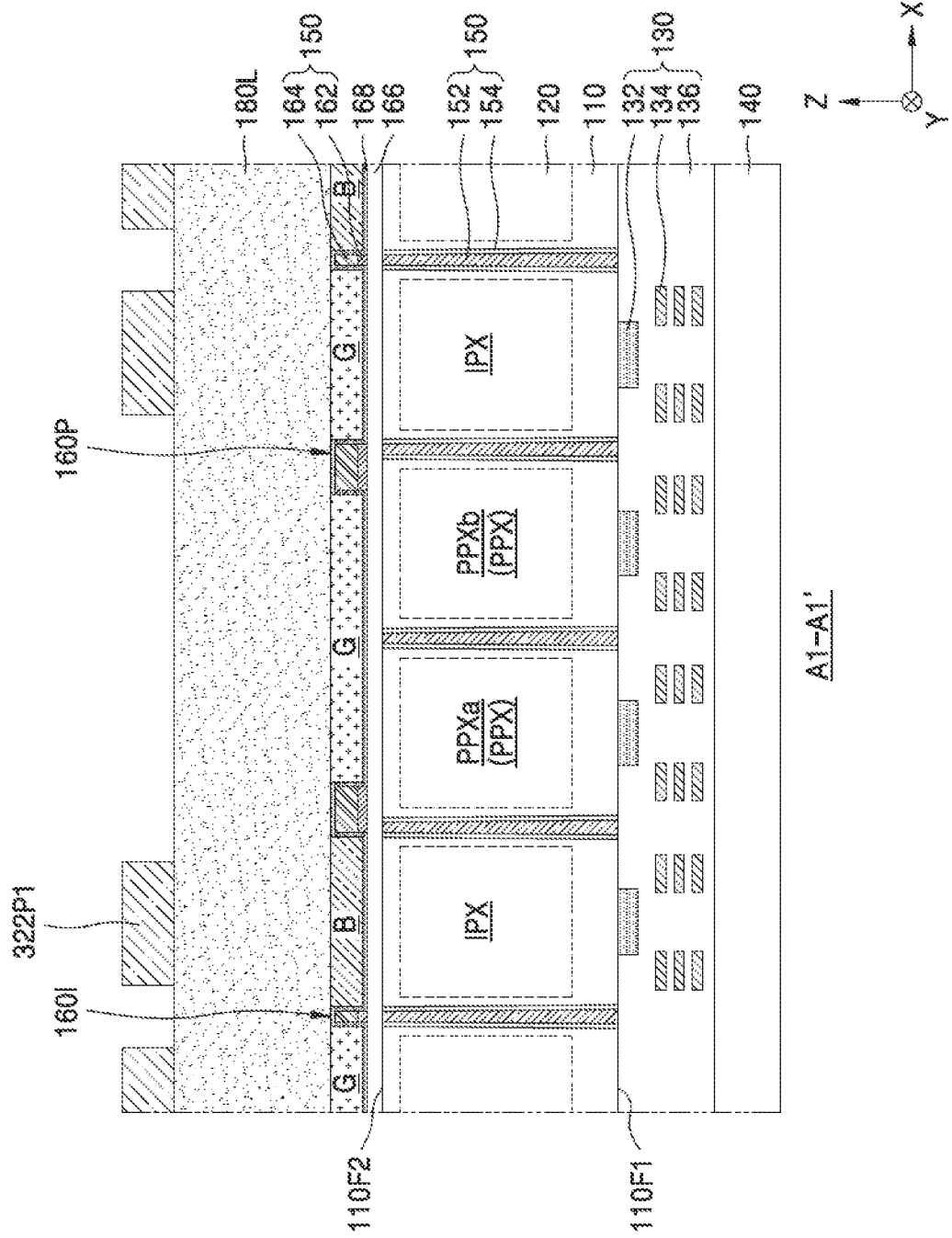

Referring to FIG. 22, a plurality of first mask patterns 322P1 may be formed on the micro-lens material layer 180L at positions overlapping a plurality of image sensing pixels IPX. Each of the first mask patterns 322P1 may include a photoresist pattern. For example, to form the first mask patterns 322P1, a photoresist material may be spin-coated. Then, an exposure process, a baking process, and a development process may be sequentially performed.

Figure 23:
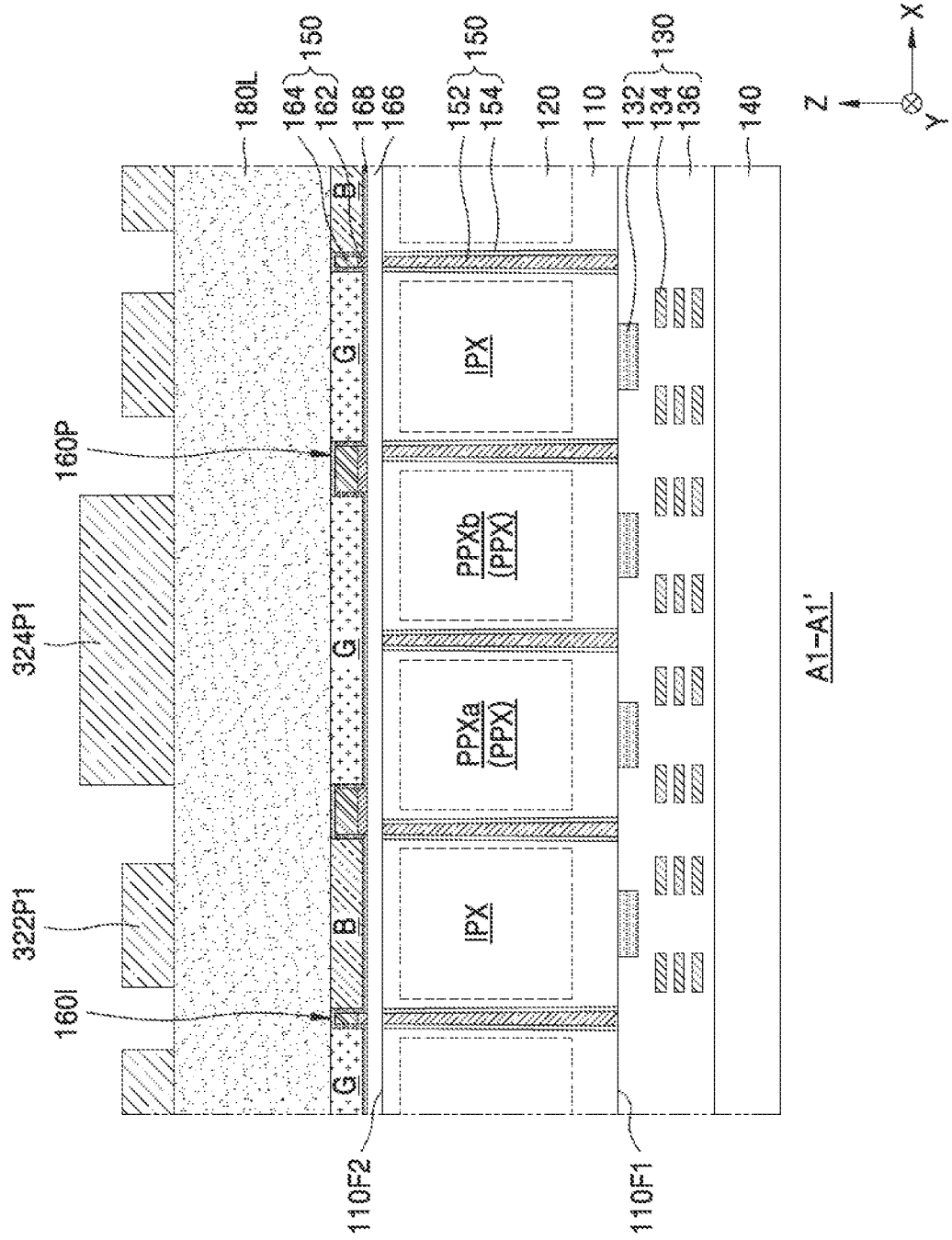

Referring to FIG. 23, a plurality of second mask patterns 324P1 may be formed on the micro-lens material layer 180L at a position overlapping the phase detection shared pixel PPX. Each of the second mask patterns 324P1 may include a photoresist pattern. Each of the second mask patterns 324P1 may be formed to have a height and a width which are greater than those of each of the first mask patterns 322P1. Also, each of the second mask patterns 324P1 may be disposed at a position vertically overlapping all of first and second phase detection subpixels PPXa and PPXb.

Figure 24:
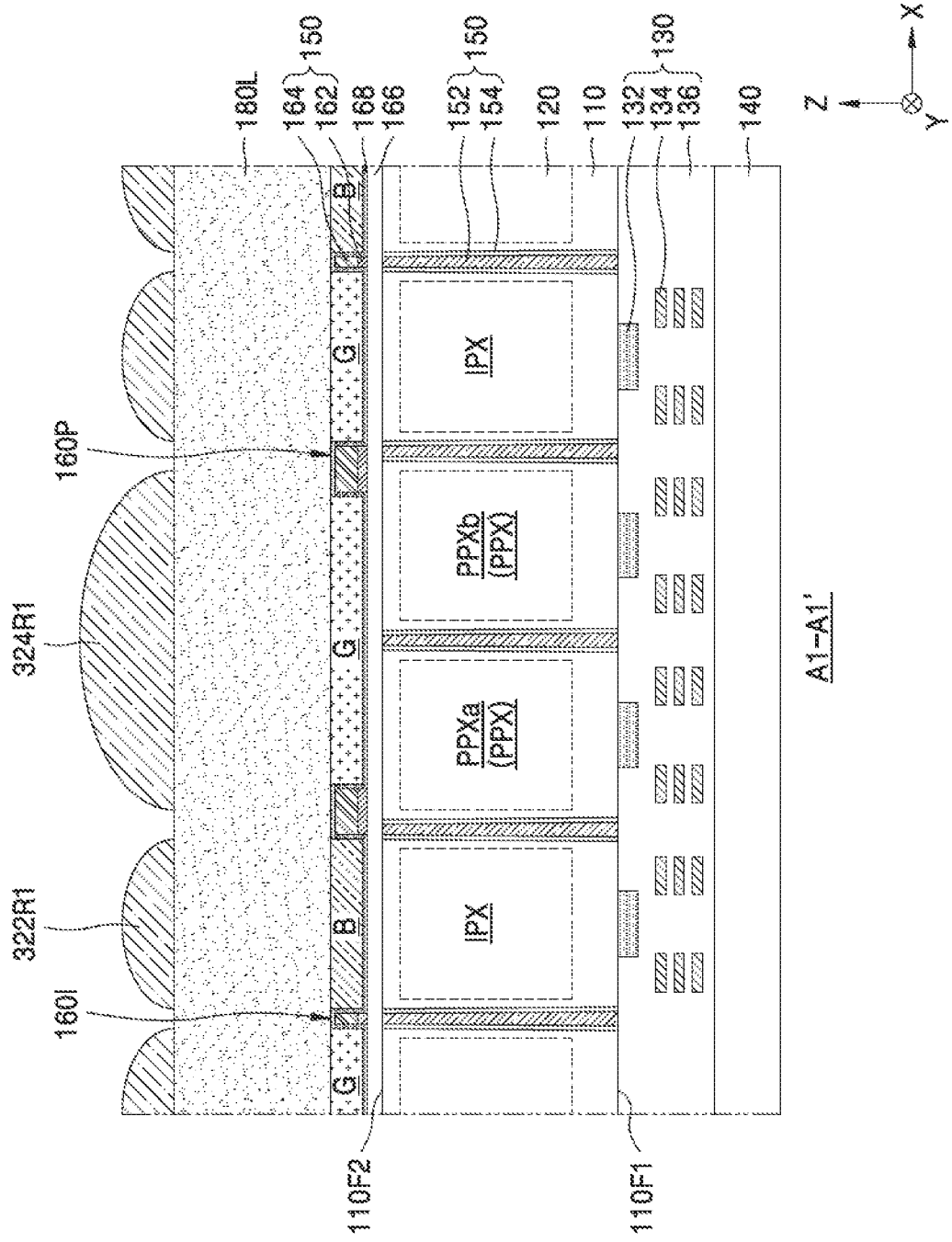

Referring to FIG. 24, the plurality of first mask patterns 322P1 may be changed to a plurality of first reflow patterns 322R1 and the plurality of second mask patterns 324P1 may be changed to a plurality of second reflow patterns 324R1 by performing a reflow process.

In embodiments of the present disclosure, due to heat which is supplied in the reflow process, the plurality of first mask patterns 322P1 and the plurality of second mask patterns 324P1 may each be changed to a semispherical shape. Therefore, the plurality of first reflow patterns 322R1 and the plurality of second reflow patterns 324R1 may be formed.

In embodiments of the present disclosure, the reflow process may be performed for several seconds to tens of minutes at a temperature of about 100° C. to about 200° C., but is not limited thereto.

Figure 25:
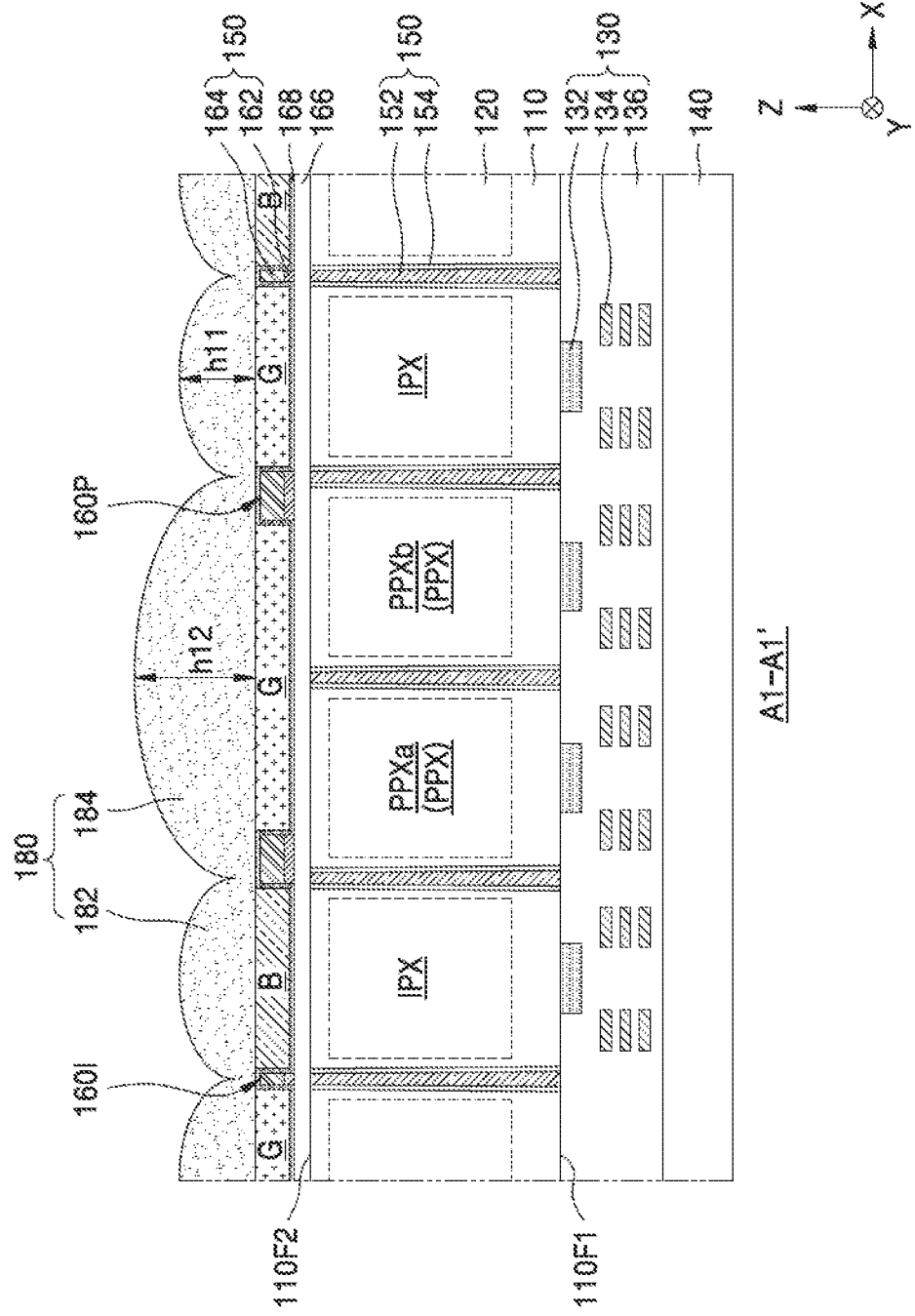

Referring to FIG. 25, by etching the micro-lens material layer 180L using the plurality of first reflow patterns 322R1 and the plurality of second reflow patterns 324R1 as an etch mask, a shape of each of the plurality of first reflow patterns 322R1 and a shape of each of the plurality of second reflow patterns 324R1 may be transferred to the first micro-lens 182 and the second micro-lens 184. At this time, an edge portion of the first micro-lens 182 may be connected to an edge portion of the second micro-lens 184.

Subsequently, a capping layer 190 may be formed on a micro-lens structure 180, including the first micro-lens 182 and the second micro-lens 184.

According to the above-described embodiments, the plurality of first mask patterns 322P1 may be first formed. Then the plurality of second mask patterns 324P1 may be formed to have a relatively larger height. Subsequently, the plurality of first mask patterns 322P1 and the plurality of second mask patterns 324P1 may be reflowed, and by performing an etch process, the micro-lens structure 180 may be formed. The image sensor 100 manufactured by the above-described method may quickly and accurately perform the AF function, thereby enhancing a sensitivity of an image sensing pixel.

Thus, according to an embodiment of the inventive concept, a method of manufacturing an image sensor is described. The method may include providing a plurality of pixels on a substrate, wherein the plurality of pixels includes one or more first pixels and one or more second pixels; providing a first micro-lens on each of the one or more first pixels using a first process; and providing a second micro-lens on each of the one or more second pixels using a second process, wherein the first micro-lens comprises a different shape from the second micro-lens.

In some cases, the method further comprises forming a micro-lens material layer over the plurality of image sensing pixels, wherein the first process comprises: forming a first mask pattern; forming a first reflow pattern based on the first mask pattern; and forming the first micro-lens from the micro-lens material layer based on the first reflow pattern; and wherein the second process comprises: forming a second mask pattern; forming a second reflow pattern based on the second mask pattern; and forming the second micro-lens based on the second reflow pattern.

In some cases, the one or more first pixels comprise image sensing pixels; and the one or more second pixels comprise phase detection shared pixels configured to generate a phase signal for calculating a phase difference between images. In some cases, a height of the second micro-lens is greater than a height of the first micro-lens.

Figure 26:
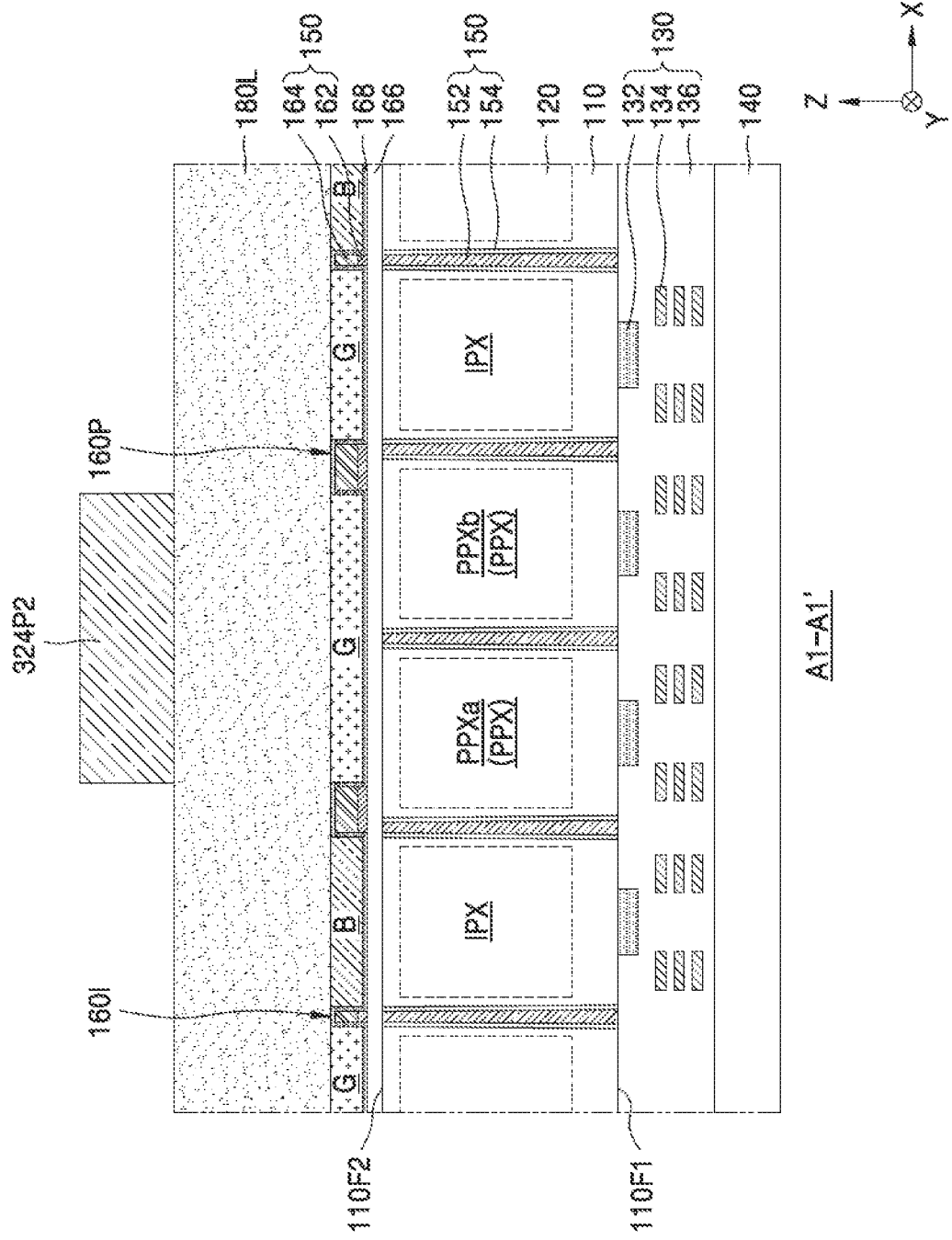
FIGS. 26 to 28 are cross-sectional views illustrating a method of manufacturing an image sensor, according to embodiments.
Figure 27:
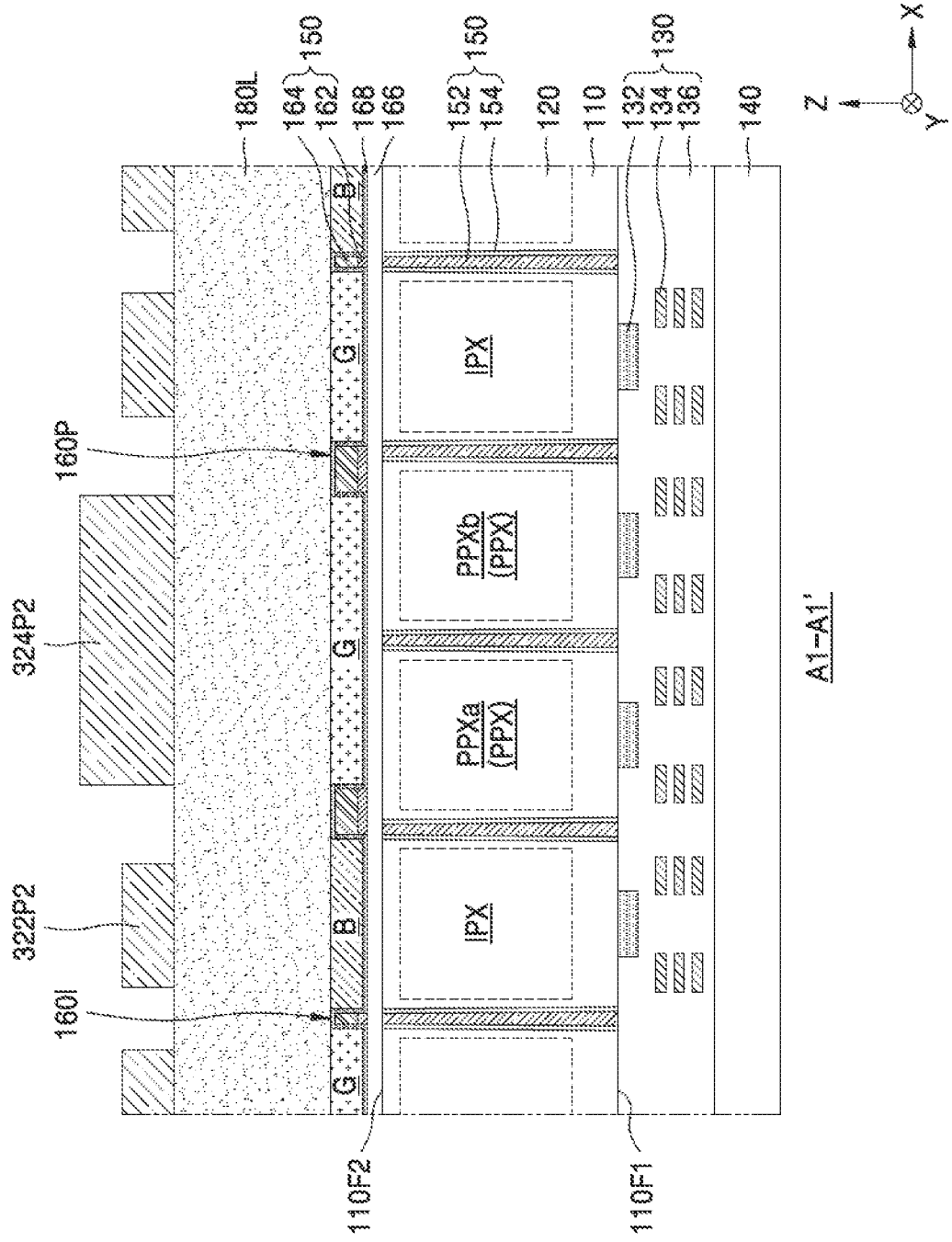
Figure 28:
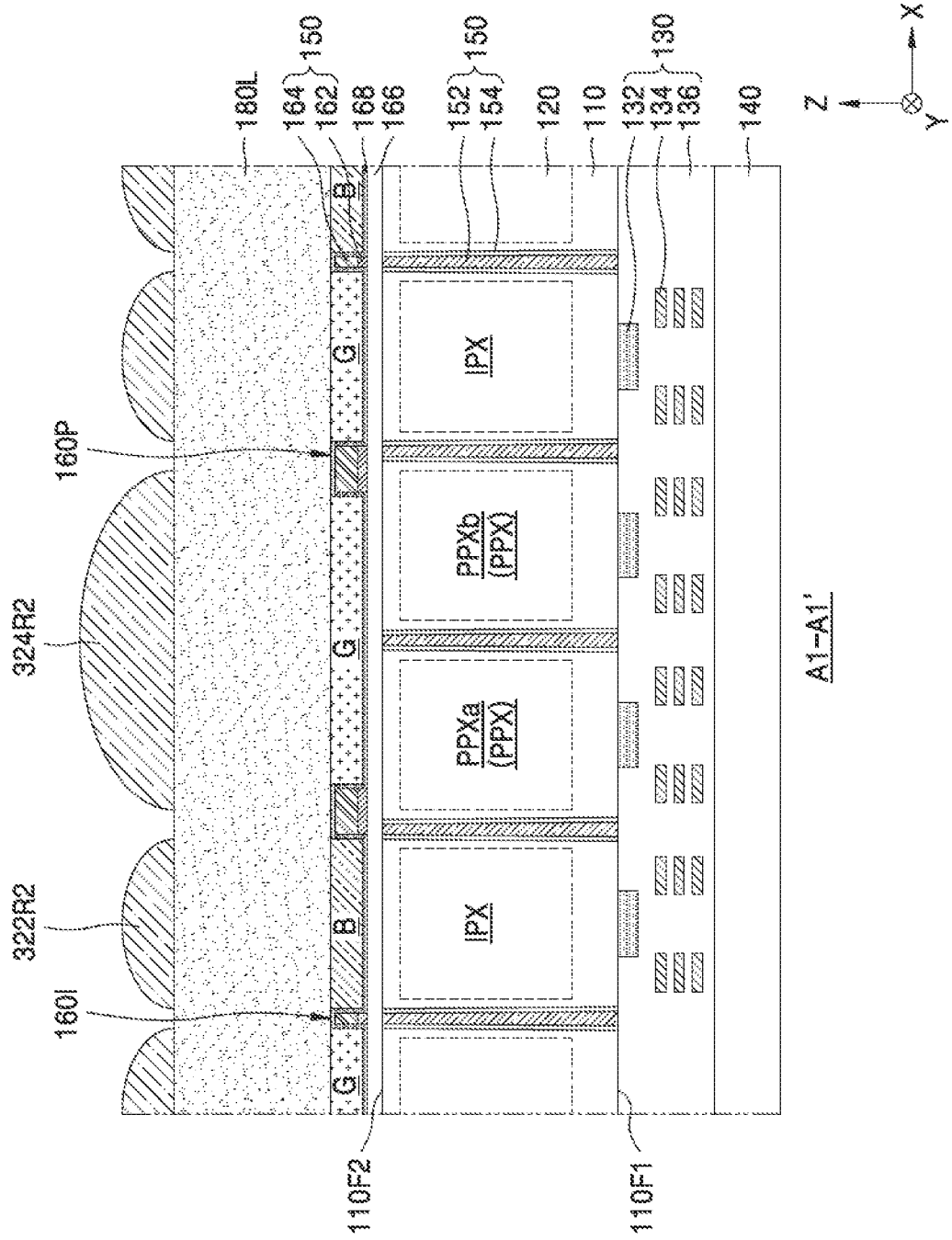

FIGS. 26 to 28 are cross-sectional views illustrating a method of manufacturing an image sensor 100 according to embodiments.

First, the processes described above with reference to FIGS. 15 to 21 may be performed.

Referring to FIG. 26, a plurality of second mask patterns 324P2 may be first formed on a micro-lens material layer 180L at a position overlapping a phase detection shared pixel PPX.

Referring to FIG. 27, each of a plurality of first mask patterns 322P2 may be formed on the micro-lens material layer 180L at positions overlapping a plurality of image sensing pixels IPX. Each of the first mask patterns 322P2 may be formed to have a height and a width which are less than those of each of the second mask patterns 322P2.

Referring to FIG. 28, the plurality of first mask patterns 322P2 may be changed to a plurality of first reflow patterns 322R2 and the plurality of second mask patterns 324P2 may be changed to a plurality of second reflow patterns 324R2 by performing a reflow process.

Subsequently, the image sensor 100 may be finished by performing the process described above with reference to FIG. 25.

FIGS. 29 to 32 are cross-sectional views illustrating a method of manufacturing an image sensor 100 according to embodiments.

First, the processes described above with reference to FIGS. 15 to 21 may be performed.

Figure 29:
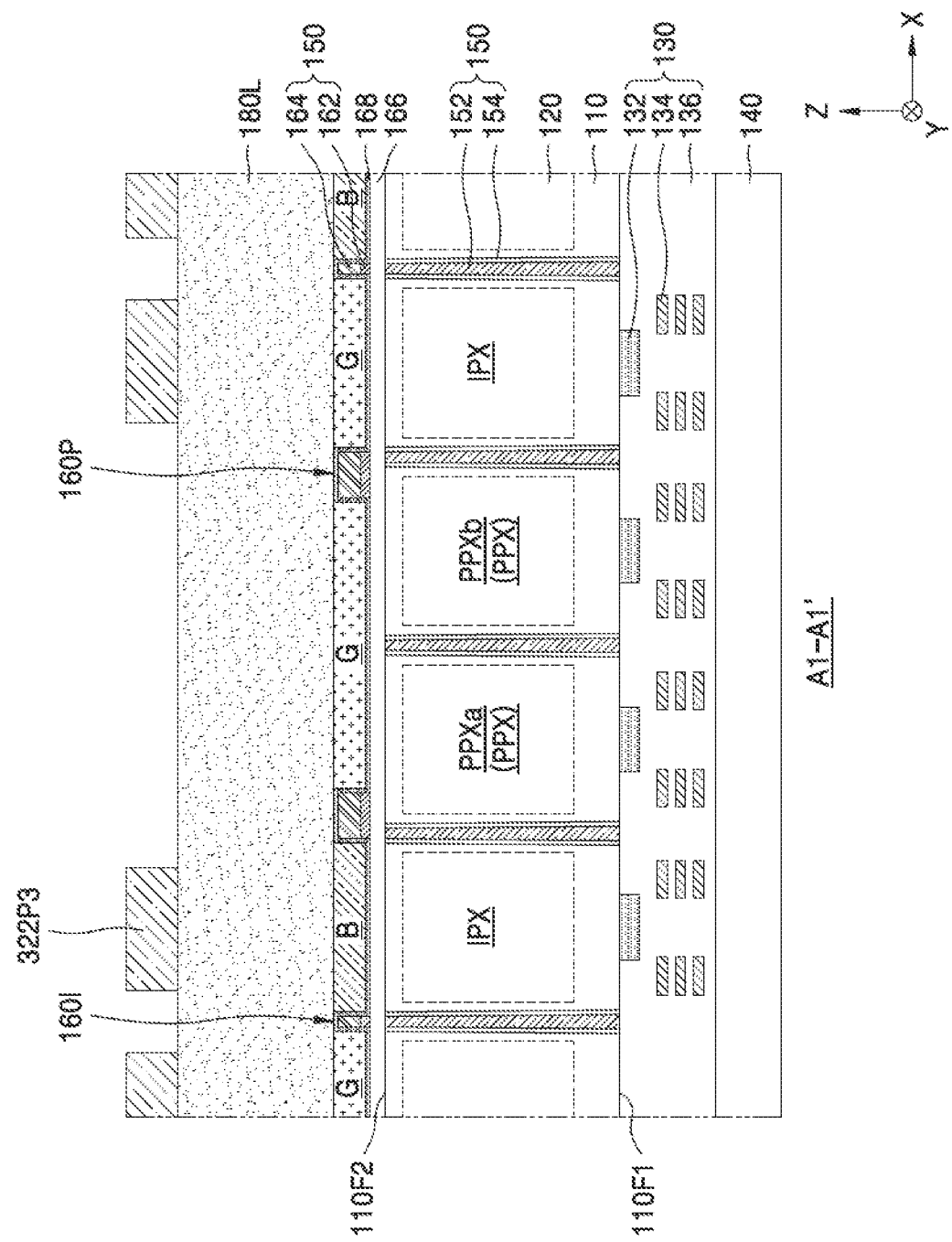
FIGS. 29 to 32 are cross-sectional views illustrating a method of manufacturing an image sensor, according to embodiments.

Referring to FIG. 29, a plurality of first mask patterns 324P3 may be formed on a micro-lens material layer 180L at positions overlapping a plurality of image sensing pixels IPX.

Figure 30:
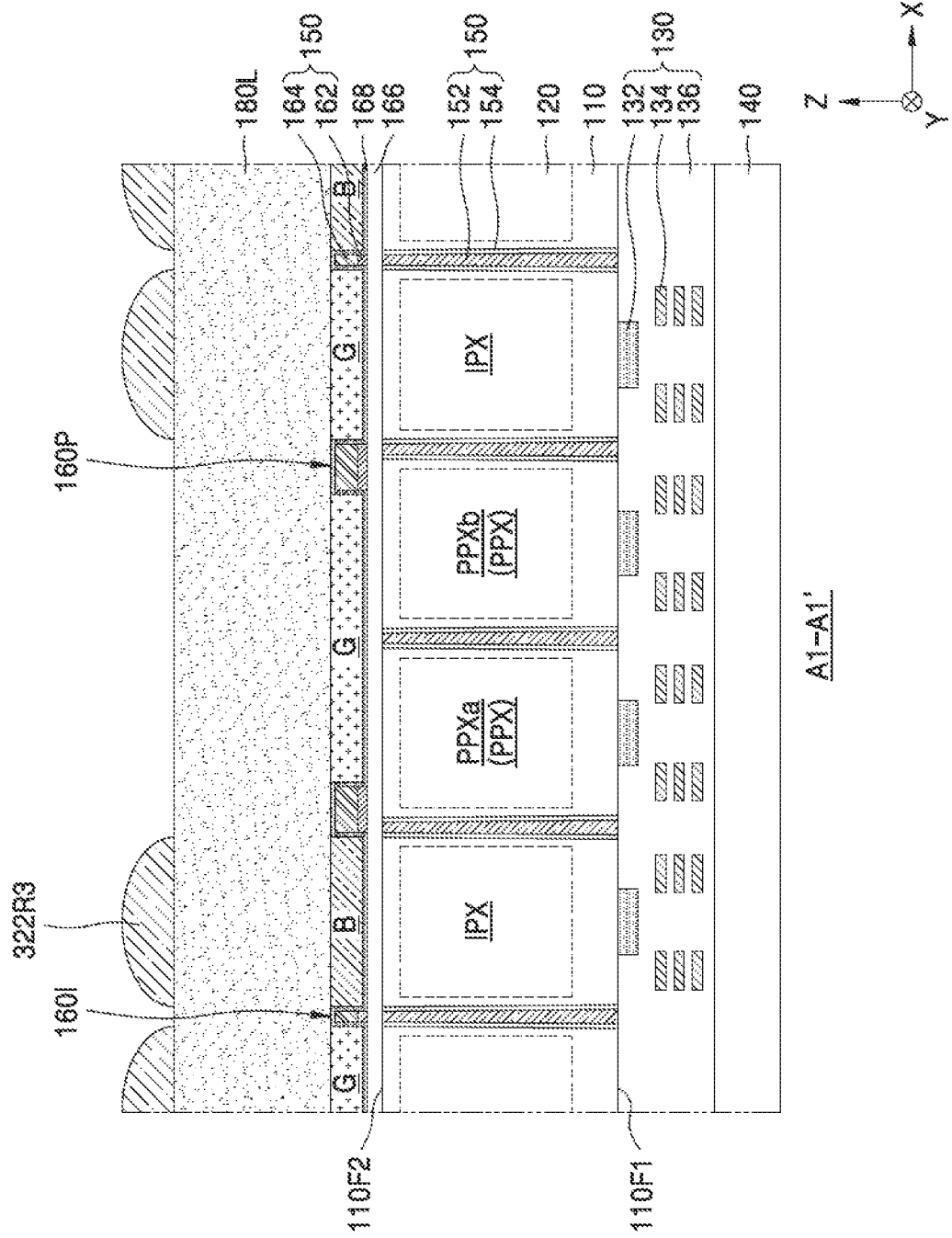

Referring to FIG. 30, by performing a first reflow process, the plurality of first mask patterns 322P3 may be respectively changed to a plurality of first reflow patterns 322R3.

Figure 31:
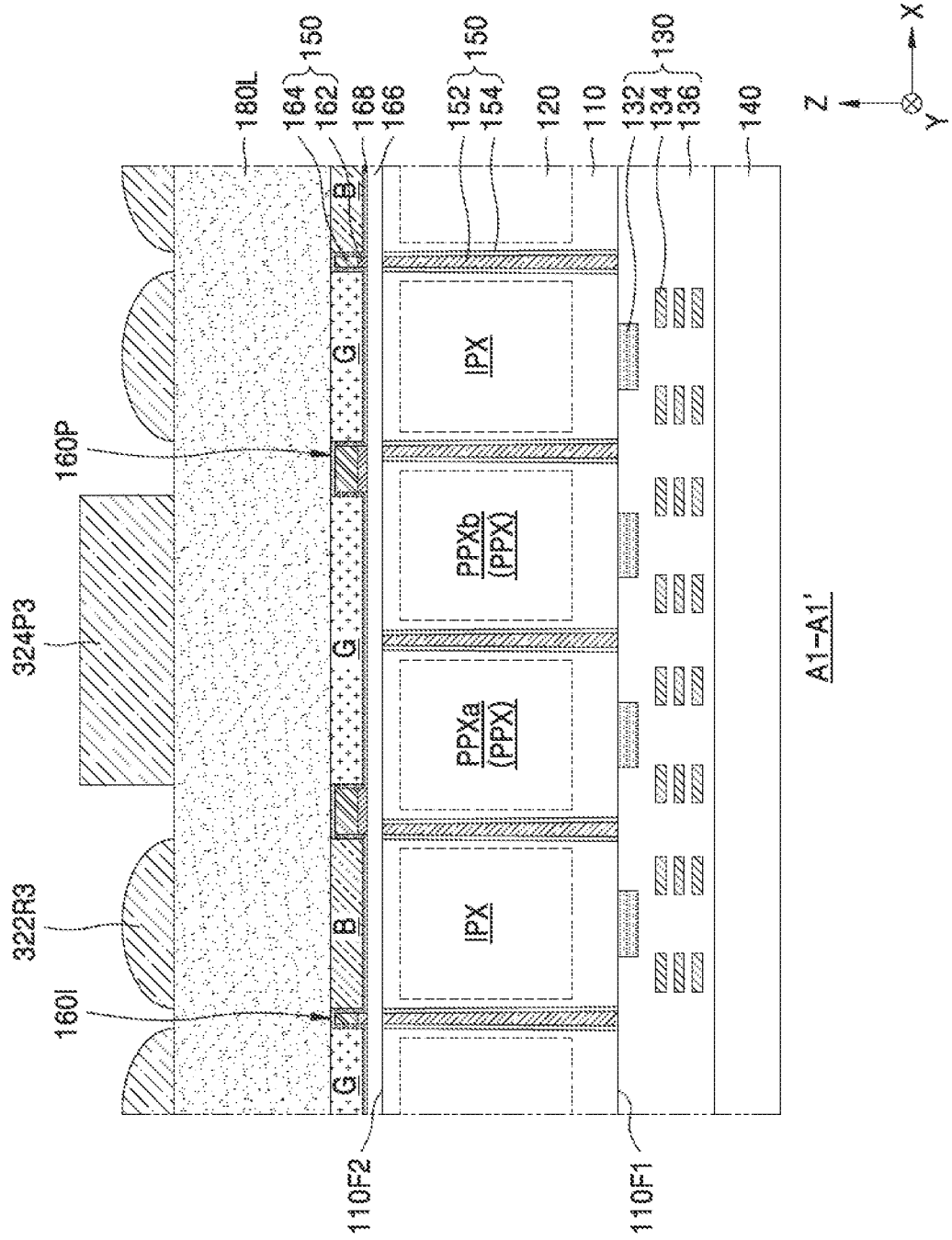

Referring to FIG. 31, a plurality of second mask patterns 324P3 may be formed on the micro-lens material layer 180L at a position overlapping a phase detection shared pixel PPX.

Figure 32:
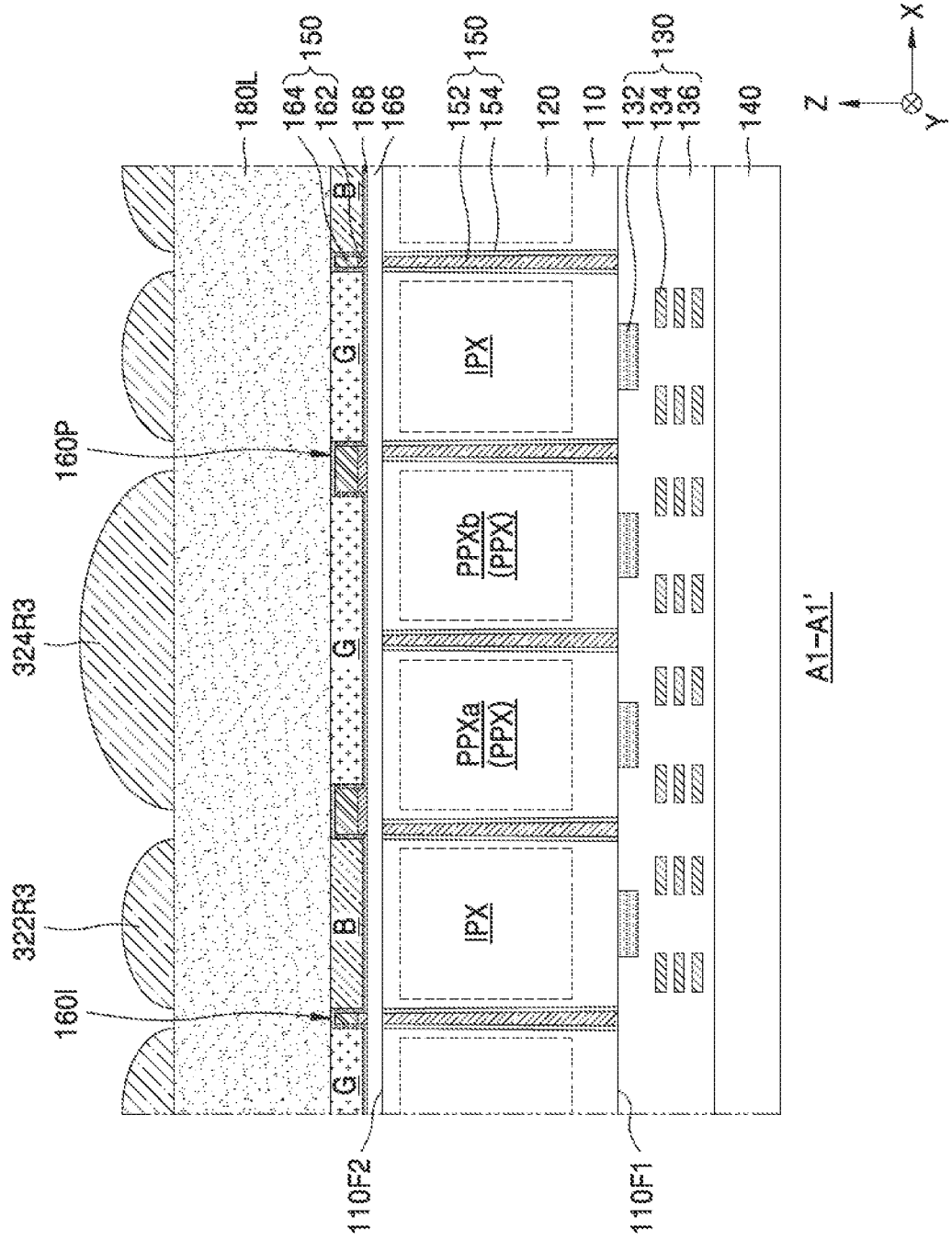

Referring to FIG. 32, the plurality of second mask patterns 324P3 may be respectively changed to a plurality of second reflow patterns 324R3 by performing a second reflow process. A shape of each of the plurality of first reflow patterns 322R3 may not be significantly changed in the second reflow process, since a shape of each of the plurality of first reflow patterns 322R3 has been changed to a semi-spherical shape in the first reflow process.

Subsequently, the image sensor 100 may be finished by performing the process described above with reference to FIG. 25.

FIGS. 33 to 36 are cross-sectional views illustrating a method of manufacturing an image sensor 100A according to embodiments.

First, the processes described above with reference to FIGS. 15 to 21 may be performed.

Figure 33:
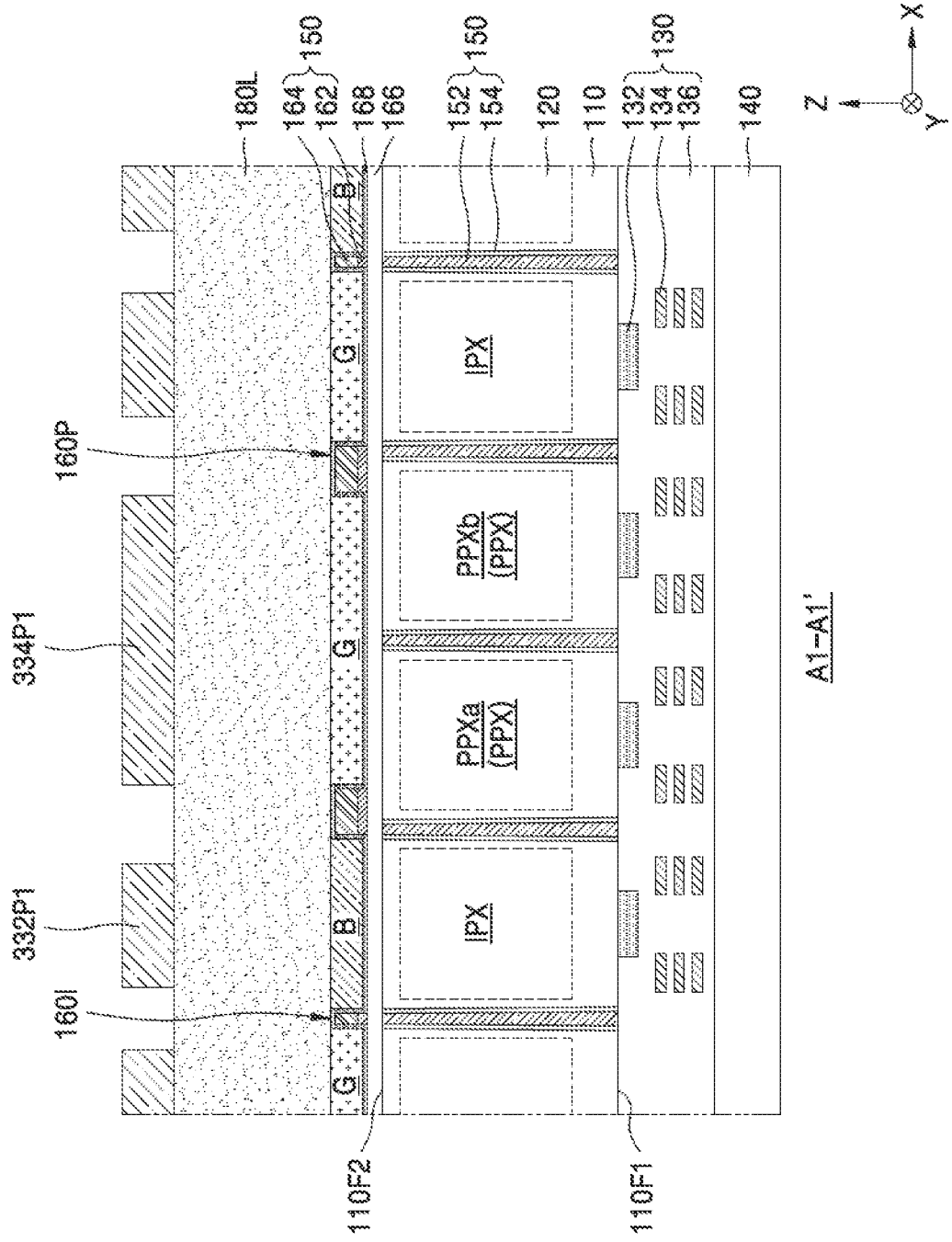
FIGS. 33 to 36 are cross-sectional views illustrating a method of manufacturing an image sensor, according to embodiments.

Referring to FIG. 33, a plurality of first mask patterns 332P1 may be formed on a micro-lens material layer 180L at positions overlapping a plurality of image sensing pixels IPX, and a plurality of second mask patterns 334P1 may be formed on the micro-lens material layer 180L at a position overlapping a phase detection shared pixel PPX. The plurality of first mask patterns 332P1 and the plurality of second mask patterns 334P1 may be formed in the same photoresist patterning process. Therefore, the plurality of first mask patterns 332P1 and the plurality of second mask patterns 334P1 may be formed to have the same height.

Figure 34:
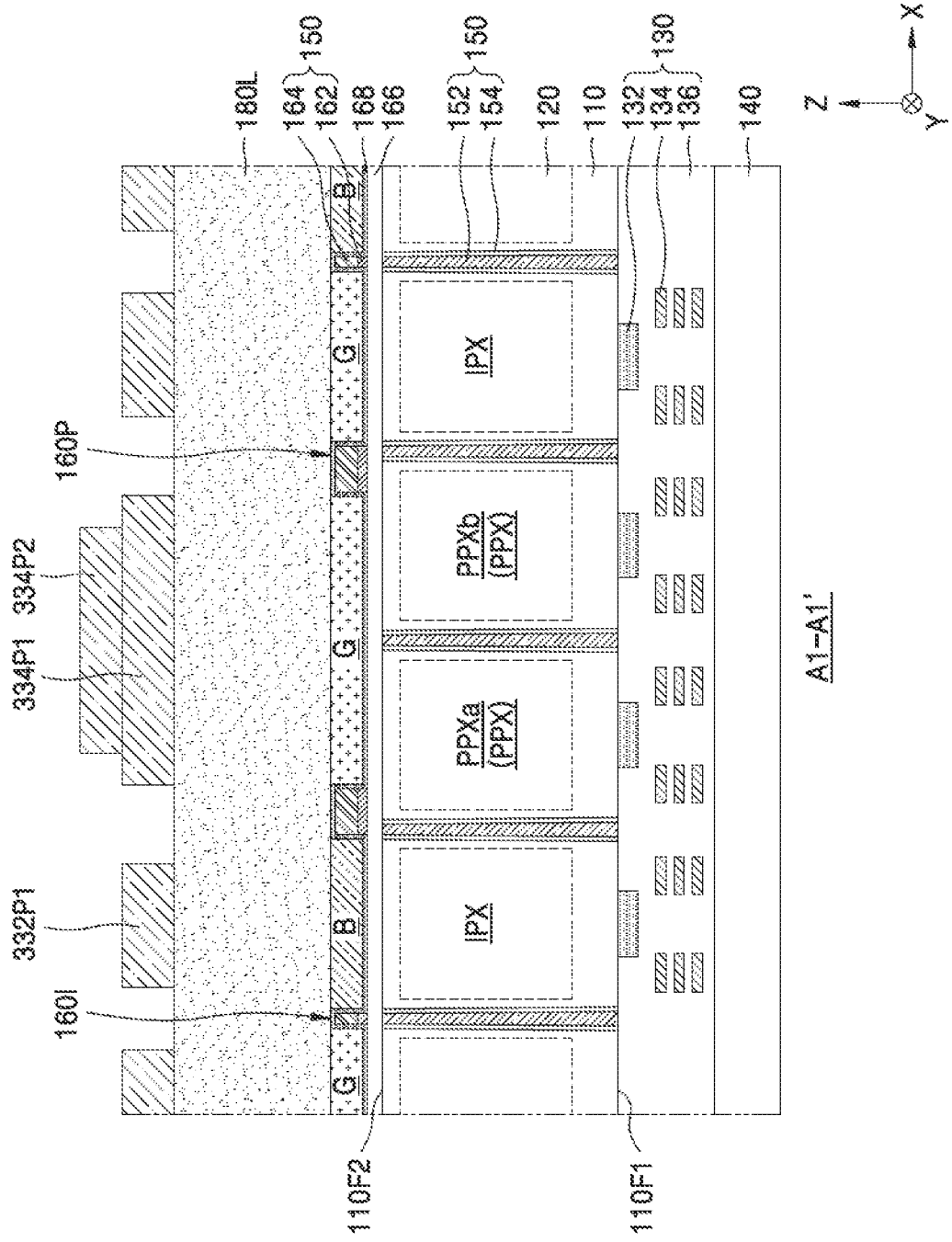

Referring to FIG. 34, a plurality of third mask patterns 334P2 may be formed on the plurality of second mask patterns 334P1 at a position overlapping a phase detection shared pixel PPX. A width and a height of each of the plurality of third mask patterns 334P2 may be determined based on a curvature and a shape of a second micro-lens 184A which is to be formed in a subsequent process. For example, in a case where the plurality of third mask patterns 334P2 are formed to have a width which is less than that of the plurality of second mask patterns 334P1 as illustrated in FIG. 34, the second micro-lens 184A may be formed to have different curvatures (or curvature radii) of an upper portion and a lower portion thereof. Alternatively, in a case where the plurality of third mask patterns 334P2 are formed to have substantially the same width as that of the plurality of second mask patterns 334P1, as illustrated in FIG. 4, the second micro-lens 184 may be formed to have a semispherical shape where a whole surface thereof has substantially the same curvature center.

Figure 35:
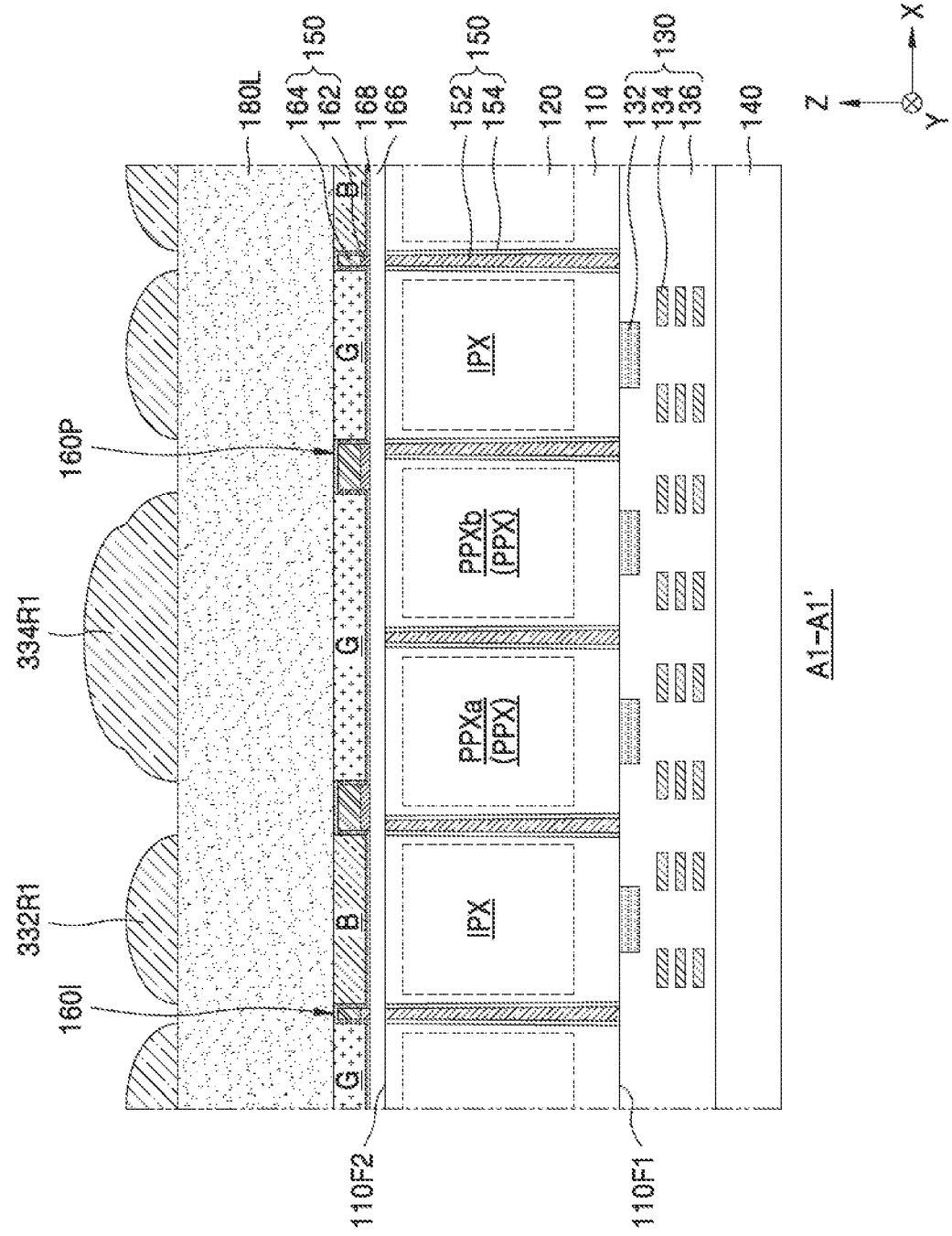

Referring to FIG. 35, the plurality of first mask patterns 332P1 may be changed to a plurality of first reflow patterns 332R1 and the plurality of second mask patterns 334P1 may be changed to a plurality of second reflow patterns 334R1 by performing a reflow process.

Figure 36:
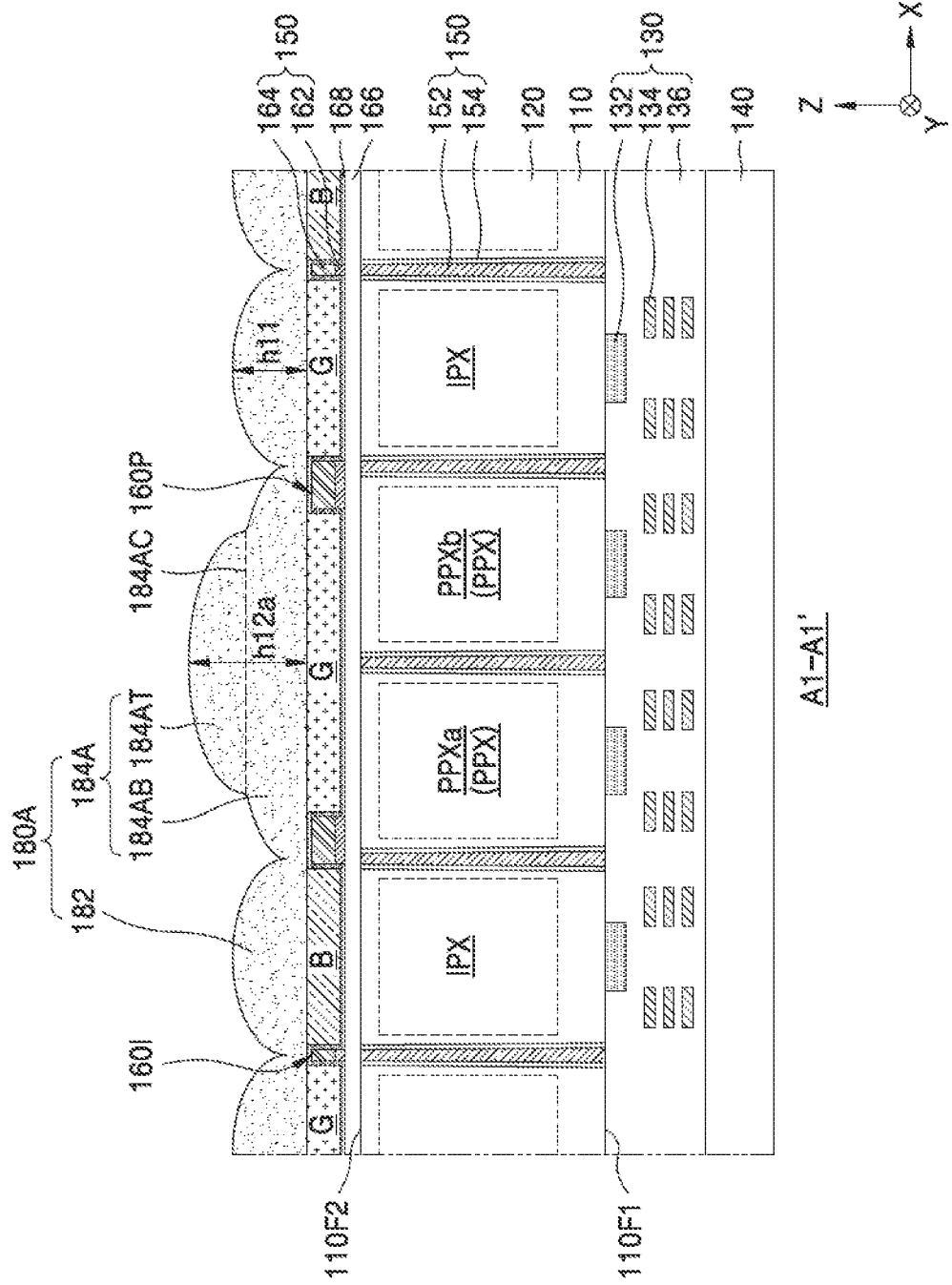

Referring to FIG. 36, by etching the micro-lens material layer 180L using the plurality of first reflow patterns 332R1 and the plurality of second reflow patterns 334R1 as an etch mask, a shape of each of the plurality of first reflow patterns 332R1 and a shape of each of the plurality of second reflow patterns 334R1 may be transferred to the first micro-lens 182 and the second micro-lens 184A.

FIGS. 37 to 40 are cross-sectional views illustrating a method of manufacturing an image sensor, according to embodiments.

First, the processes described above with reference to FIGS. 15 to 21 may be performed.

Figure 37:
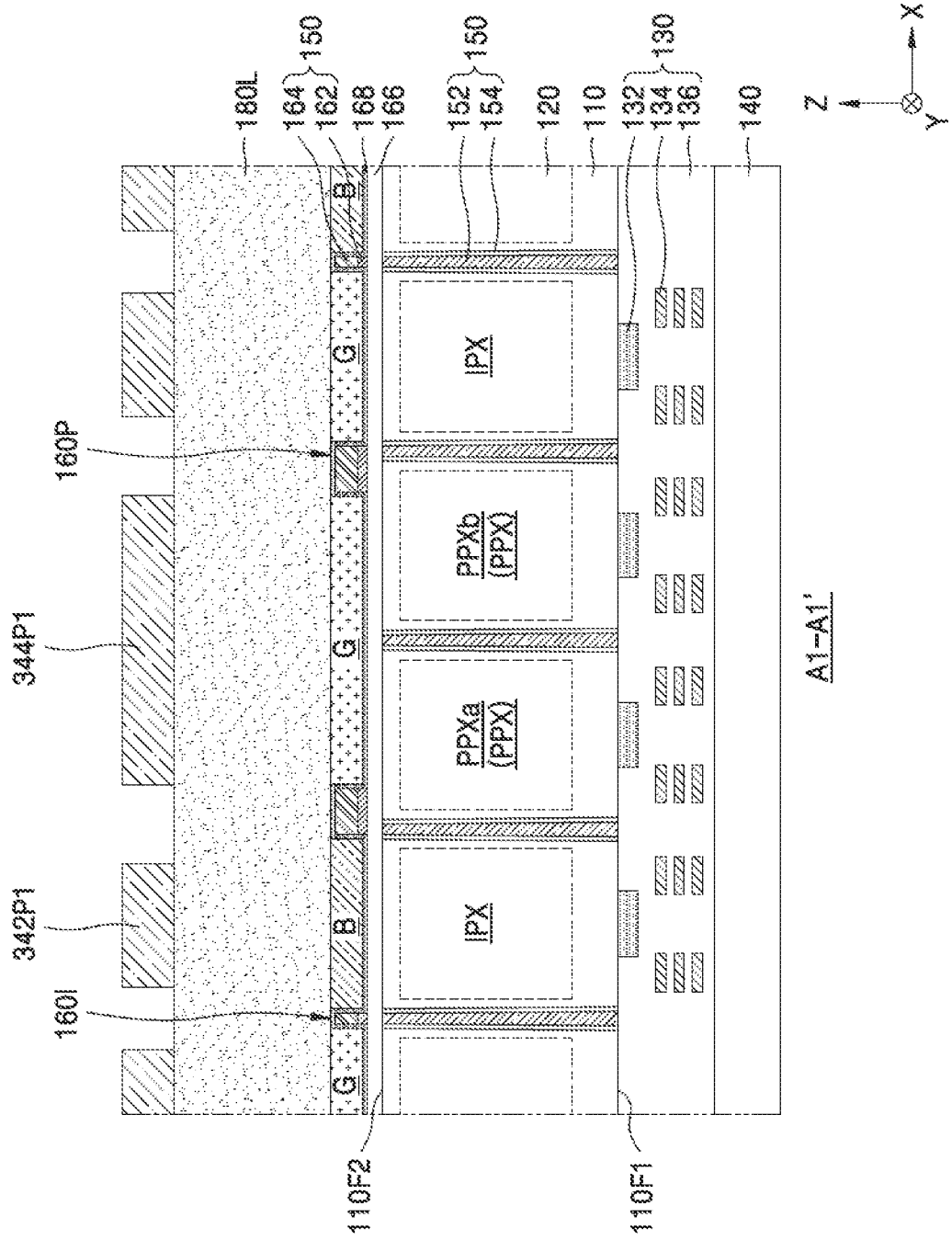
FIGS. 37 to 40 are cross-sectional views illustrating a method of manufacturing an image sensor, according to embodiments.

Referring to FIG. 37, a plurality of first mask patterns 342P1 may be formed on a micro-lens material layer 180L at positions overlapping a plurality of image sensing pixels IPX, and a plurality of second mask patterns 344P1 may be formed on the micro-lens material layer 180L at a position overlapping a phase detection shared pixel PPX. The plurality of first mask patterns 342P1 and the plurality of second mask patterns 344P1 may be formed in the same photoresist patterning process. Therefore, the plurality of first mask patterns 342P1 and the plurality of second mask patterns 344P1 may be formed to have the same height.

Figure 38:
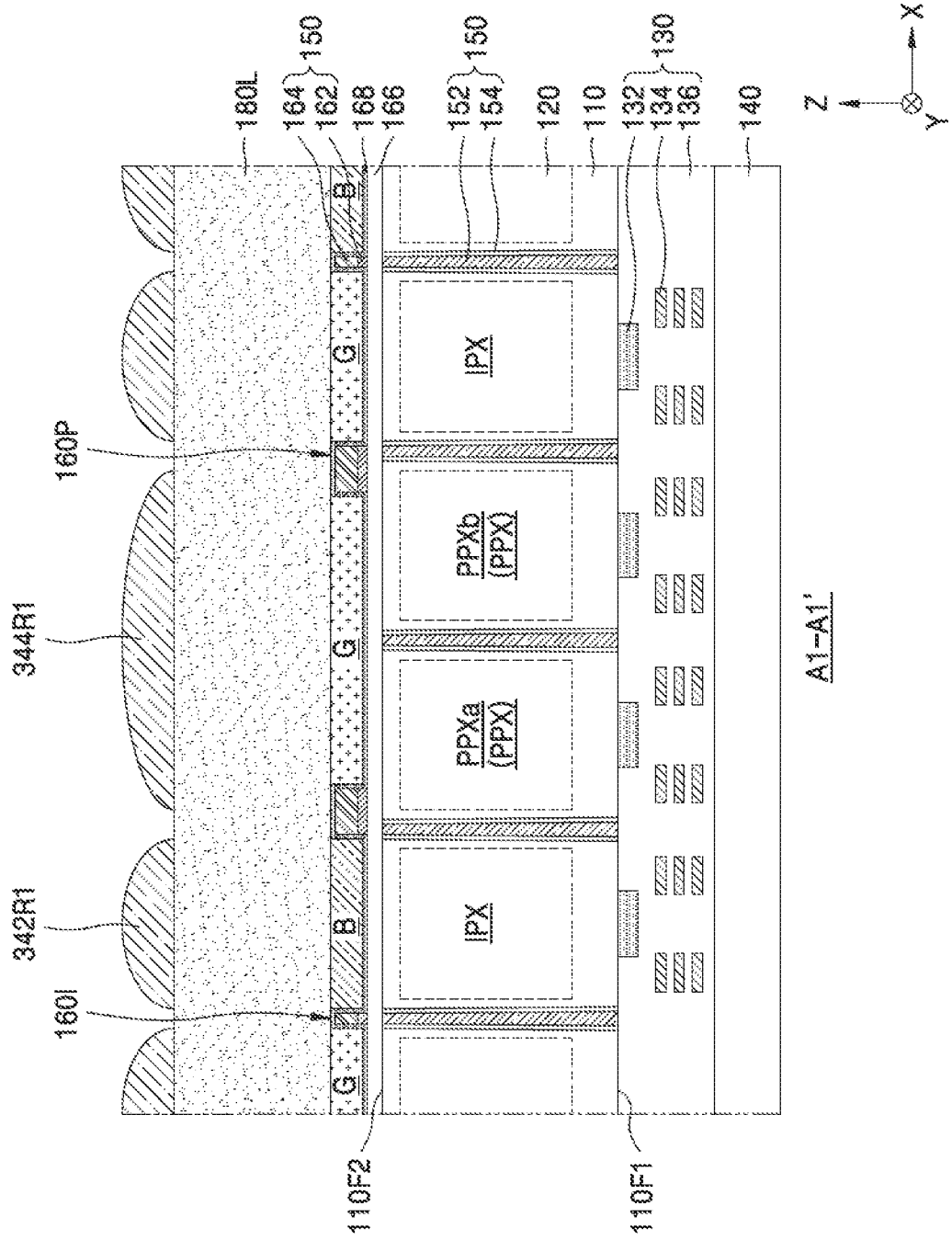

Referring to FIG. 38, the plurality of first mask patterns 342P1 may be changed to a plurality of first reflow patterns 342R1 and the plurality of second mask patterns 344P1 may be changed to a plurality of second reflow patterns 344R1 by performing a reflow process.

Figure 39:
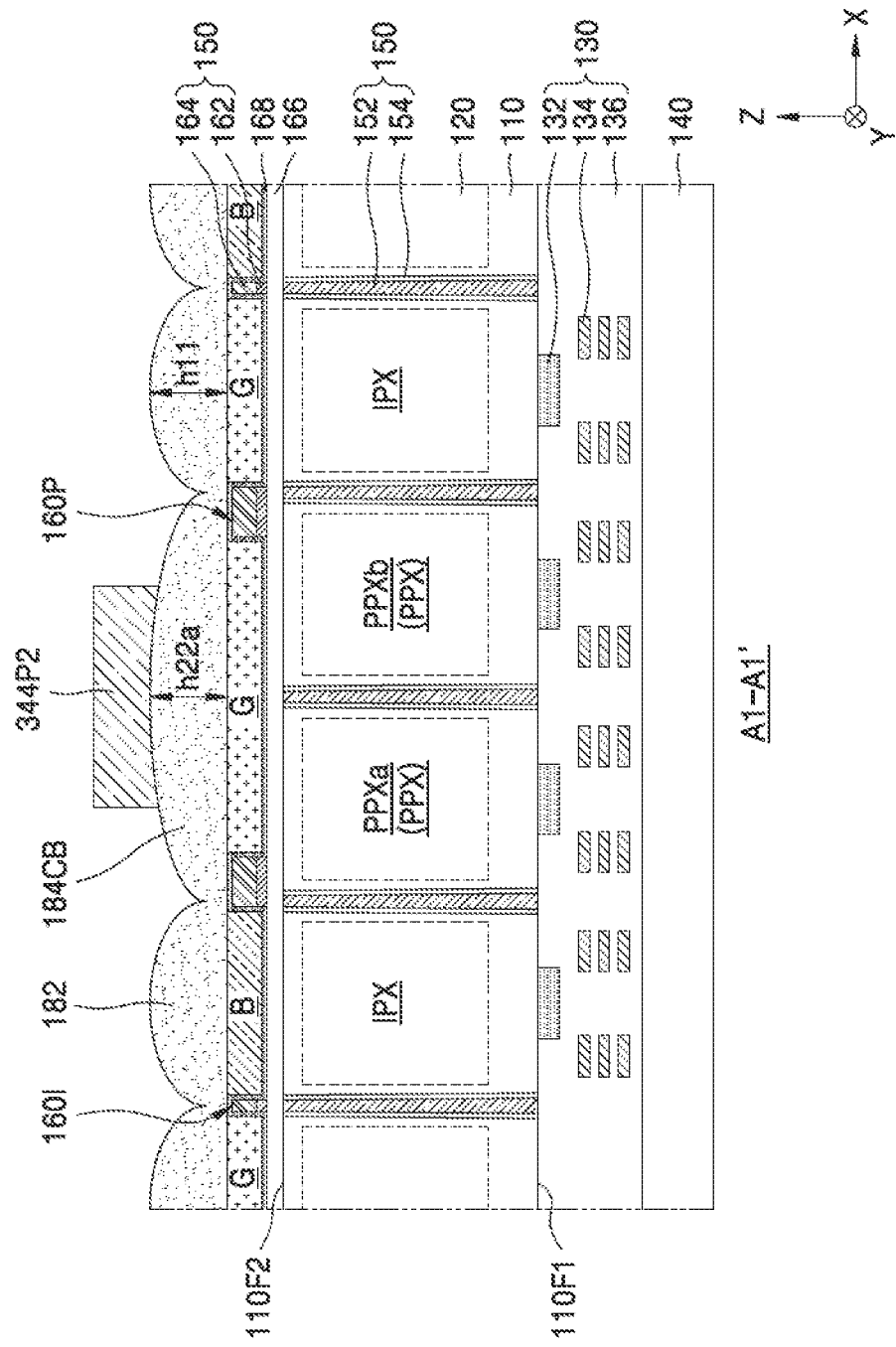

Referring to FIG. 39, a shape of each of the plurality of first reflow patterns 342R1 and a shape of each of the plurality of second reflow patterns 344R1 may be transferred to the first micro-lens 182 and a bottom micro-lens part 184CB by etching the micro-lens material layer 180L. Etching the micro-lens material is performed using the plurality of first reflow patterns 342R1 and the plurality of second reflow patterns 344R1 as an etch mask.

The bottom micro-lens part 184CB may be formed to have a second height h22a which is substantially the same as or similar to a first height h11 of the first micro-lens 182.

Subsequently, a plurality of third mask patterns 344P2 may be formed on the bottom micro-lens part 184CB.

Figure 40:
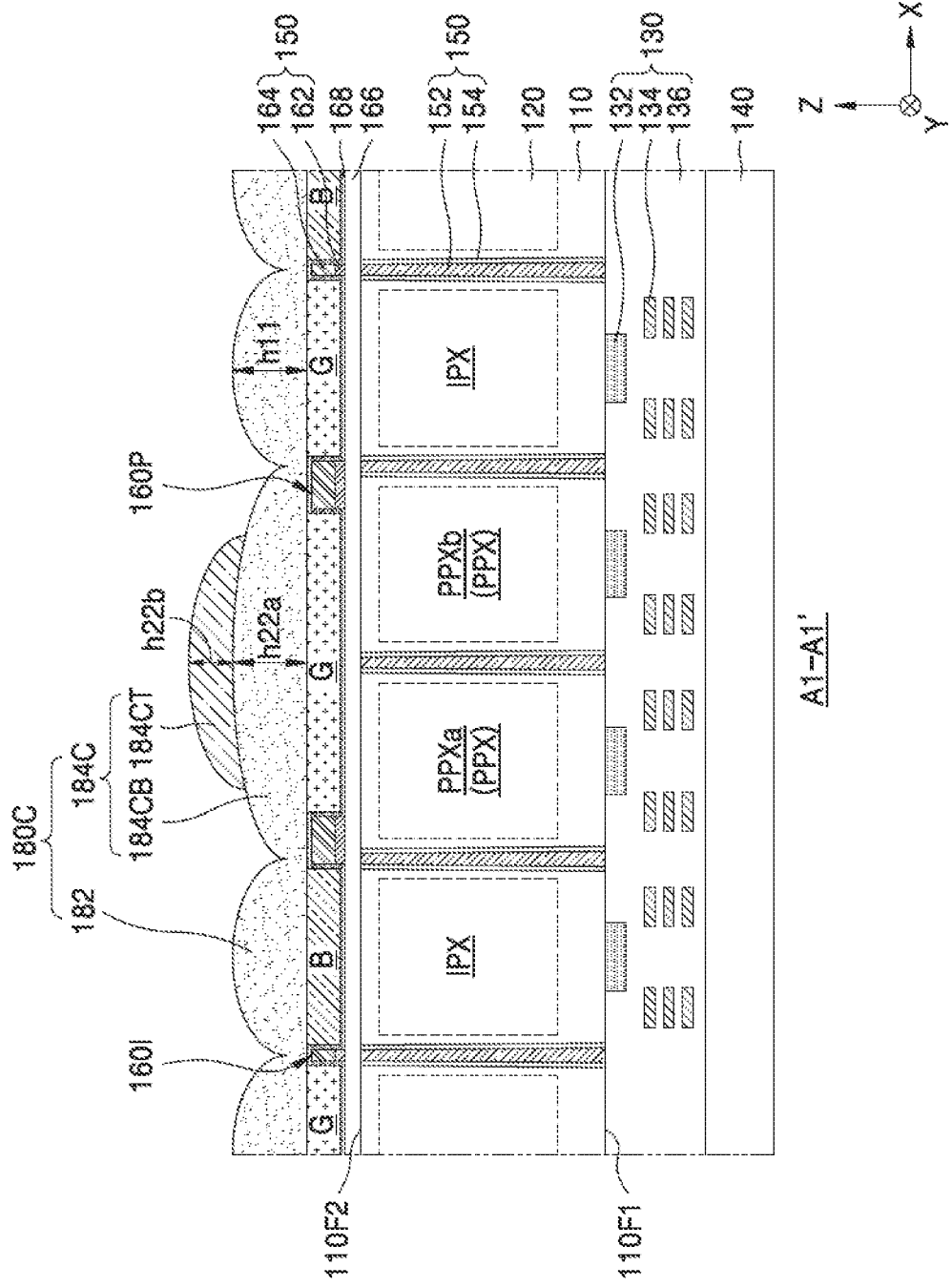

Referring to FIG. 40, the plurality of third mask patterns 344P2 may be respectively changed to a plurality of top micro-lens parts 184CT by performing a reflow process. The bottom micro-lens part 184CB may be formed in a semi-spherical shape with a third height h22b through the reflow process.

Subsequently, a capping layer 190 may be formed on a micro-lens structure 180 including the first micro-lens 182 and a second micro-lens 184C.

According to the above-described embodiments, the first micro-lens 182 and a plurality of second micro-lenses 184, 184A, 184B, and 184C may be formed to have different heights. Therefore, the first micro-lens 182 may have a curvature (or a height) optimized for an SNR characteristic of an image sensing pixel IPX and the second micro-lenses 184, 184A, 184B, and 184C may have a curvature (or a height) optimized for an AF separation ratio characteristic of a phase detection shared pixel PPX. The image sensors 100 to 100E, manufactured by the above-described method, may quickly and accurately perform the AF function, thereby increasing a sensitivity of an image sensing pixel.

While the inventive concept has been particularly shown and described with reference to embodiments thereof, it will be understood that various changes in form and details may be made therein without departing from the spirit and scope of the following claims.

The invention claimed is:

1. An image sensor comprising:
a pixel array, the pixel array including:
a first phase detection subpixel and a second phase detection subpixel provided in a substrate and forming a first phase detection pixel, each of the first and second phase detection subpixels including a photodiode;
a first image sensing subpixel and a second image sensing subpixel provided in the substrate, each of the first and second image sensing subpixels including a photodiode;
a first micro-lens disposed on the first and second phase detection subpixels in a first direction;
a third micro-lens disposed on the first image sensing subpixel; and
a fourth micro-lens disposed on the second image sensing subpixel, and
a color filter fence disposed on an upper surface of the substrate, the color filter fence defining a plurality of color filter spaces in which a plurality of color filter layers are disposed,
wherein the color filter fence includes:
a first portion disposed on a side of the first phase detection pixel in the first direction, and
a second portion between the first image sensing subpixel and the second image sensing subpixel,
wherein the first portion has a first width in the first direction, the second portion has a second width in the first direction, and the second width is smaller than the first width.

2. The image sensor of claim 1, wherein the first and second phase detection subpixels and the first and second image sensing subpixels are arranged in a 2×2 matrix form, and
the first and second phase detection subpixels include a first color filter layer exhibiting a first color, and the first and second image sensing subpixels each include color filter layers exhibiting the first color.

3. The image sensor of claim 1, wherein the first and second image sensing subpixels are respectively disposed closest to the first and second phase detection subpixels in a second direction perpendicular to the first direction, and
the first and second image sensing subpixels include color filter layers exhibiting a same color.

4. The image sensor of claim 3, wherein the first and second image sensing subpixels include the color filter layers exhibiting green color.

5. The image sensor of claim 1, further comprising:
a third phase detection subpixel and a fourth phase detection subpixel provided in the substrate, each of the third and fourth phase detection subpixels including a photodiode;
a second micro-lens disposed on the third and fourth phase detection subpixels in a second direction perpendicular to the first direction; and
a third image sensing subpixel and a fourth image sensing subpixel provided in the substrate, each of the third and fourth image sensing subpixels including a photodiode,
wherein the third and fourth image sensing subpixels are disposed next to the third and fourth phase detection subpixels in the first direction, respectively, such that the third and fourth phase detection subpixels are disposed between the third and fourth image sensing subpixels, and
the third and fourth image sensing subpixels include color filter layers exhibiting a same color.

6. The image sensor of claim 5, wherein the first, second, third, and fourth phase detection subpixels include color filter layers exhibiting green color.

7. The image sensor of claim 1, wherein the first micro-lens has a first height, and the third micro-lens has a second height which is smaller than the first height.

8. The image sensor of claim 7, wherein the third phase detection subpixel and the fourth phase detection subpixel form a second phase detection pixel, wherein the color filter fence includes a third portion disposed on a side of the second phase detection pixel in the second direction, and the third portion has the first width.

9. An image sensor comprising:
a pixel array, the pixel array including:
a first phase detection subpixel and a second phase detection subpixel provided in a substrate, each of the first and second phase detection subpixels including a photodiode;
a first image sensing subpixel and a second image sensing subpixel provided in the substrate, each of the first and second image sensing subpixels including a photodiode;
a first micro-lens disposed on the first and second phase detection subpixels in a first direction;
a second micro-lens disposed on the first image sensing subpixel; and
a third micro-lens disposed on the second image sensing subpixel; and
a color filter fence disposed on an upper surface of the substrate, the color filter fence defining a plurality of color filter spaces in which a color filter layer is disposed,
wherein the color filter fence includes:
a first portion being next to the first and second phase detection subpixels, and
a second portion being next to the first image sensing subpixel,
wherein the first portion has a first width in the first direction, the second portion has a second width in the first direction, and the second width is smaller than the first width.

10. The image sensor of claim 9, wherein a first portion disposed vertically overlapping a boundary of the first and second phase detection subpixels and a portion of the first and second phase detection subpixels.

11. The image sensor of claim 9, wherein the second portion does not overlap the first image sensing subpixel.

12. The image sensor of claim 9, wherein the first micro-lens has a first height, and the second micro-lens has a second height which is smaller than the first height.

13. The image sensor of claim 12, wherein the third micro-lens has the second height.

14. The image sensor of claim 9, wherein the first and second phase detection subpixels form a phase detection pixel and the first portion is disposed overlapping sides of the phase detection pixel in the first direction.

15. An image sensor comprising:
a pixel array, the pixel array including:
a first phase detection subpixel and a second phase detection subpixel provided in a substrate, each of the first and second phase detection subpixels including a photodiode;
a first image sensing subpixel, a second image sensing subpixel, and a third image sensing subpixel, a fourth image sensing subpixel, a fifth image sensing subpixel, and a sixth image sensing subpixel provided in the substrate, each of the first to sixth image sensing subpixels including a photodiode;
a first micro-lens disposed on the first and second phase detection subpixels in a first direction;
a second micro-lens disposed on the first image sensing subpixel;
a third micro-lens disposed on the second image sensing subpixel;
a fourth micro-lens disposed on the third image sensing subpixel;
a fifth micro-lens disposed on the fourth image sensing subpixel;
a sixth micro-lens disposed on the fifth image sensing subpixel; and
a seventh micro-lens disposed on the sixth image sensing subpixel,
wherein the first to third image sensing subpixels and the first phase detection subpixel are arranged in a 2×2 matrix form and each include a color filter layer exhibiting a first color,
the fourth to sixth image sensing subpixels and the second phase detection subpixel are arranged in a 2×2 matrix form,
the second phase detection subpixel shares the color filter layer of the first phase detection subpixel exhibiting the first color, and
the fourth to sixth image sensing subpixels each include a color filter layer exhibiting a second color different than the first color.

16. The image sensor of claim 15, wherein the first color is a green color.

17. The image sensor of claim 15, wherein the first micro-lens has a first height, and the second micro-lens has a second height which is smaller than the first height.

18. The image sensor of claim 17, wherein the third to seventh micro-lens each have the second height.

19. The image sensor of claim 15, further comprising a color filter fence disposed on an upper surface of the substrate, the color filter fence defining a plurality of color filter spaces in which the color filter layers are disposed,
wherein the color filter fence includes:
a first portion disposed vertically overlapping a boundary of the first and second phase detection subpixels, and
a second portion disposed vertically overlapping a boundary of the first image sensing subpixel disposed away from the first and second phase detection subpixels,
wherein the first portion has a first width in the first direction, the second portion has a second width in the first direction, and the second width is smaller than the first width.

20. The image sensor of claim 15, further comprising a color filter fence disposed on an upper surface of the substrate, the color filter fence defining a plurality of color filter spaces in which the color filter layers are disposed,
wherein the color filter fence includes:
a first portion disposed vertically overlapping a boundary of the first and second phase detection subpixels and a portion of the first and second phase detection subpixels, and
a second portion disposed vertically overlapping a boundary between the first and second phase detection subpixels,
wherein the first portion has a first width in the first direction, the second portion has a second width in the first direction, and the second width is smaller than the first width.

* * * * *